(12) United States Patent
Kim

(10) Patent No.: US 11,374,202 B2
(45) Date of Patent: Jun. 28, 2022

(54) LIGHT EMITTING DEVICE AND METHOD OF MANUFACTURING THE SAME

(71) Applicant: Samsung Electronics Co., Ltd., Suwon-si (KR)

(72) Inventor: Myoungsoo Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 79 days.

(21) Appl. No.: 16/877,303

(22) Filed: May 18, 2020

(65) Prior Publication Data
US 2021/0074953 A1    Mar. 11, 2021

(30) Foreign Application Priority Data

Sep. 11, 2019  (KR) .......................... 10-2019-0112589

(51) Int. Cl.
*H01L 51/52* (2006.01)
*H01L 51/56* (2006.01)
*H01L 27/32* (2006.01)

(52) U.S. Cl.
CPC ...... *H01L 51/5271* (2013.01); *H01L 27/3258* (2013.01); *H01L 51/56* (2013.01)

(58) Field of Classification Search
CPC ................... H01L 27/3248; H01L 51/5271
See application file for complete search history.

(56) References Cited

U.S. PATENT DOCUMENTS 6,372,608 B1    4/2002   Shimoda et al.
6,645,830 B2   11/2003   Shimoda et al.
(Continued)

FOREIGN PATENT DOCUMENTS

JP      2017068927    4/2017
KR   1020090003590   1/2009
KR   1020100084229   7/2010

*Primary Examiner* — Bryan R Junge
(74) *Attorney, Agent, or Firm* — Myers Bigel, P.A.

(57) ABSTRACT

A light emitting device includes a substrate; a circuit region including a circuit device on the substrate; an insulating layer on the circuit region; a first light emitting region connecting portion, a second light emitting region connecting portion, and a third light emitting region connecting portion, in the insulating layer; and a light emitting portion including a first light emitting region on the first light emitting region connecting portion, a second light emitting region on the second light emitting region connecting portion, and a third light emitting region on the third light emitting region connecting portion, the first light emitting region connecting portion includes first light reflective layers including a first lower light reflective layer, a first intermediate light reflective layer on the first lower light reflective layer, and a first upper light reflective layer on the first intermediate light reflective layer, and at least one first via plug connected to the first light emitting region, the second light emitting region connecting portion includes second light reflective layers including a second lower light reflective layer, and a second upper light reflective layer on the second lower light reflective layer, and at least one second via plug connected to the second light emitting region, and the third light emitting region connecting portion includes a third light reflective layer, and a third via plug connected to the third light emitting region.

19 Claims, 28 Drawing Sheets

I-I'

(56) References Cited

U.S. PATENT DOCUMENTS

| | | |
|---|---|---|
| RE38,466 E | 6/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,111,881 B2 | 8/2015 | Hanamura |
| 9,142,599 B2 | 9/2015 | Koshihara et al. |
| 10,326,096 B2 | 6/2019 | Kato et al. |
| 2014/0197395 A1* | 7/2014 | Ariyoshi ............ H01L 51/5218 257/40 |
| 2015/0060807 A1* | 3/2015 | Koshihara ........... H01L 27/3258 257/40 |
| 2015/0108446 A1 | 4/2015 | Ando |
| 2015/0340645 A1 | 11/2015 | Guo et al. |
| 2016/0233284 A1 | 8/2016 | Hanamura et al. |
| 2016/0315131 A1 | 10/2016 | Li et al. |
| 2017/0236881 A1 | 8/2017 | Shen et al. |
| 2018/0219170 A1* | 8/2018 | Kato .................. H01L 51/5265 |
| 2018/0269267 A1 | 9/2018 | Ohchi |
| 2020/0136095 A1* | 4/2020 | Ju ...................... H01L 51/5265 |
| 2021/0020868 A1* | 1/2021 | Ikeda .................. H01L 27/3211 |
| 2021/0066416 A1* | 3/2021 | Yang .................. H01L 51/5265 |

\* cited by examiner

LIGHT EMITTING DEVICE AND METHOD OF MANUFACTURING THE SAME

CROSS-REFERENCE TO RELATED APPLICATION(S)

This application claims priority under 35 U.S.C § 119 to Korean Patent Application No. 10-2019-0112589 filed on Sep. 11, 2019 in the Korean Intellectual Property Office, the disclosure of which is incorporated herein by reference in its entirety.

BACKGROUND

Example embodiments of the present inventive concept relate to light emitting devices and methods of manufacturing the same.

A variety of planar displays, such as a liquid crystal display (LCD), a field emission display (FED), an organic light emitting diode (OLED), and the like, are presently used. A microdisplay having pixels smaller than before has been applied to products such as a head mounted display (HMD), and the like, as well as a virtual reality (VR) or augmented reality glasses monitor. To improve optical properties such as resolution, luminance, light emitting efficiency, and the like, used in a microdisplay, a liquid crystal on silicon (LCoS) and an organic light emitting diode on silicon (OLEDoS) have been developed. The OLEDoS is a display technique using a semiconductor process on a wafer substrate, and when using the OLEDoS, an OLED may be disposed on a semiconductor wafer substrate on which a complementary metal oxide semiconductor (CMOS) is disposed.

SUMMARY

Example embodiments of the present inventive concept may provide a light emitting device having improved optical properties.

According to an example embodiment of the present inventive concept, a light emitting device includes a substrate; a circuit region including a circuit device on the substrate; an insulating layer on the circuit region; a first light emitting region connecting portion, a second light emitting region connecting portion, and a third light emitting region connecting portion in the insulating layer; and a light emitting portion including a first light emitting region on the first light emitting region connecting portion, a second light emitting region on the second light emitting region connecting portion, and a third light emitting region on the third light emitting region connecting portion, the first light emitting region connecting portion includes first light reflective layers including a first lower light reflective layer, a first intermediate light reflective layer on the first lower light reflective layer, and a first upper light reflective layer on the first intermediate light reflective layer, and one or more first via plug connected to the first light emitting region, the second light emitting region connecting portion includes second light reflective layers including a second lower light reflective layer, and a second upper light reflective layer on the second lower light reflective layer, and one or more second via plug connected to the second light emitting region, and the third light emitting region connecting portion includes a third light reflective layer, and a third via plug connected to the third light emitting region.

According to an example embodiment of the present inventive concept, a light emitting device includes a substrate; an insulating layer on the substrate; and a first light emitting region connecting portion, a second light emitting region connecting portion, and a third light emitting region connecting portion, in the insulating layer, the first light emitting region connecting portion includes first light reflective layers having a multilayer structure, vertically stacked in the insulating layer, and spaced apart from each other, and one or more first via plugs connected to one or more of the first light reflective layers, respectively, the second light emitting region connecting portion includes second light reflective layers having a multilayer structure, vertically disposed in the insulating layer, and spaced apart from each other, and one or more second via plugs connected to one or more of the second light reflective layers, respectively, and the third light emitting region connecting portion includes a third light emitting layer in the insulating layer, and a third via plug connected to the third light reflective layer.

According to an example embodiment of the present inventive concept, a light emitting device includes a substrate having an upper surface extending in a first direction and a second direction; an insulating layer on the substrate; a first light reflective layer, a second light reflective layer, and a third light reflective layer, in the insulating layer and spaced apart from one another in the first direction; a light emitting portion on the insulating layer, and including first electrodes, a light emitting layer, and a second electrode; and a first connection via plug connecting the first light reflective layer to a first one of the first electrodes, a second connection via plug connecting the second light reflective layer to a second one of the first electrodes, and a third connection via plug connecting the third light reflective layer to a third one of the first electrodes, and at least one of the first, second, and third light reflective layers includes a plurality of stacked layers having different widths in the first direction.

According to an example embodiment of the present inventive concept, a method of manufacturing a light emitting device includes forming a stack structure by alternately stacking metal layers and interlayer insulating layers on a substrate; forming stack structure patterns in which the metal layers are divided for a plurality of light emitting regions by removing a portion of the stack structure; forming an insulating layer comprising an insulating material layer along with the interlayer insulating layers, the insulating material layer being on the stack structure patterns and having a planarized upper portion; forming via plugs penetrating the insulating layer and connected to the divided metal layers, respectively; and forming a light emitting portion including a first electrode, a light emitting layer, and a second electrode on the insulating layer.

According to an example embodiment of the present inventive concept, a method of manufacturing a light emitting device includes forming a metal layer on a substrate; forming metal patterns corresponding to a plurality of light emitting regions, respectively, where forming the metal patterns includes dividing a lower region of the metal layer so as to have a plurality of step portions by removing a portion of the metal layer; forming an insulating layer including an insulating material on the metal patterns; and planarizing an upper portion of the insulating layer; forming via plugs penetrating the insulating layer, the via plugs being connected to the metal patterns, respectively; and forming a light emitting portion including a first electrode, a light emitting layer, and a second electrode on the insulating layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
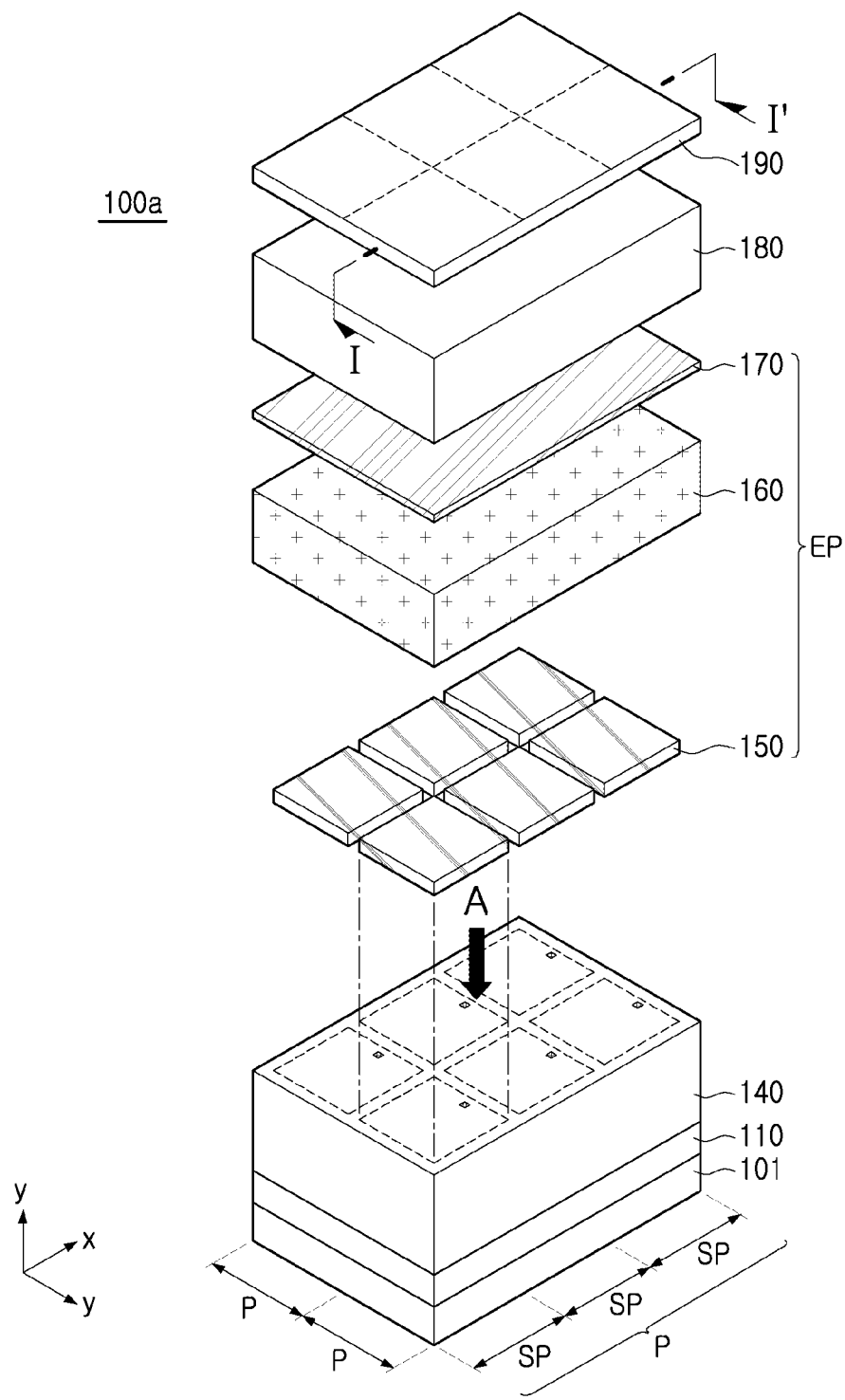
FIG. 1 is a perspective diagram illustrating a light emitting device according to some example embodiments of the present inventive concept.

Hereinafter, embodiments of the present inventive concept will be described as follows with reference to the accompanying drawings. The same reference numerals of the same reference designators may denote the same elements or components throughout the specification. As used herein, the term "and/or" includes any and all combinations of one or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

Figure 2A:
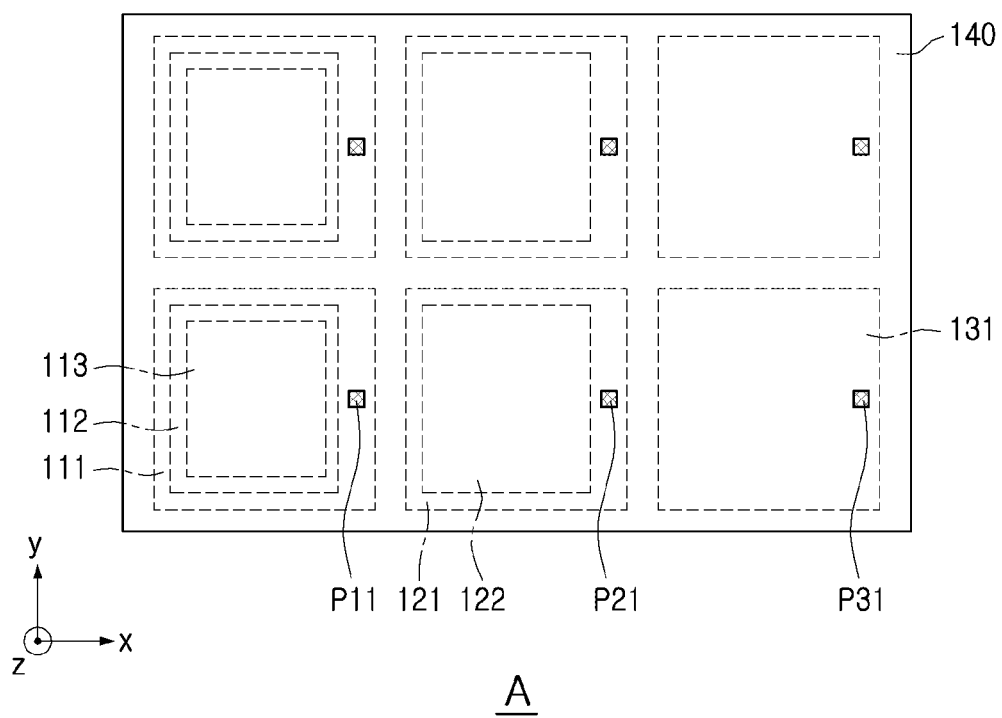
FIG. 2A is a plan diagram illustrating a portion of a light emitting device according to some example embodiments of the present inventive concept.
Figure 2B:
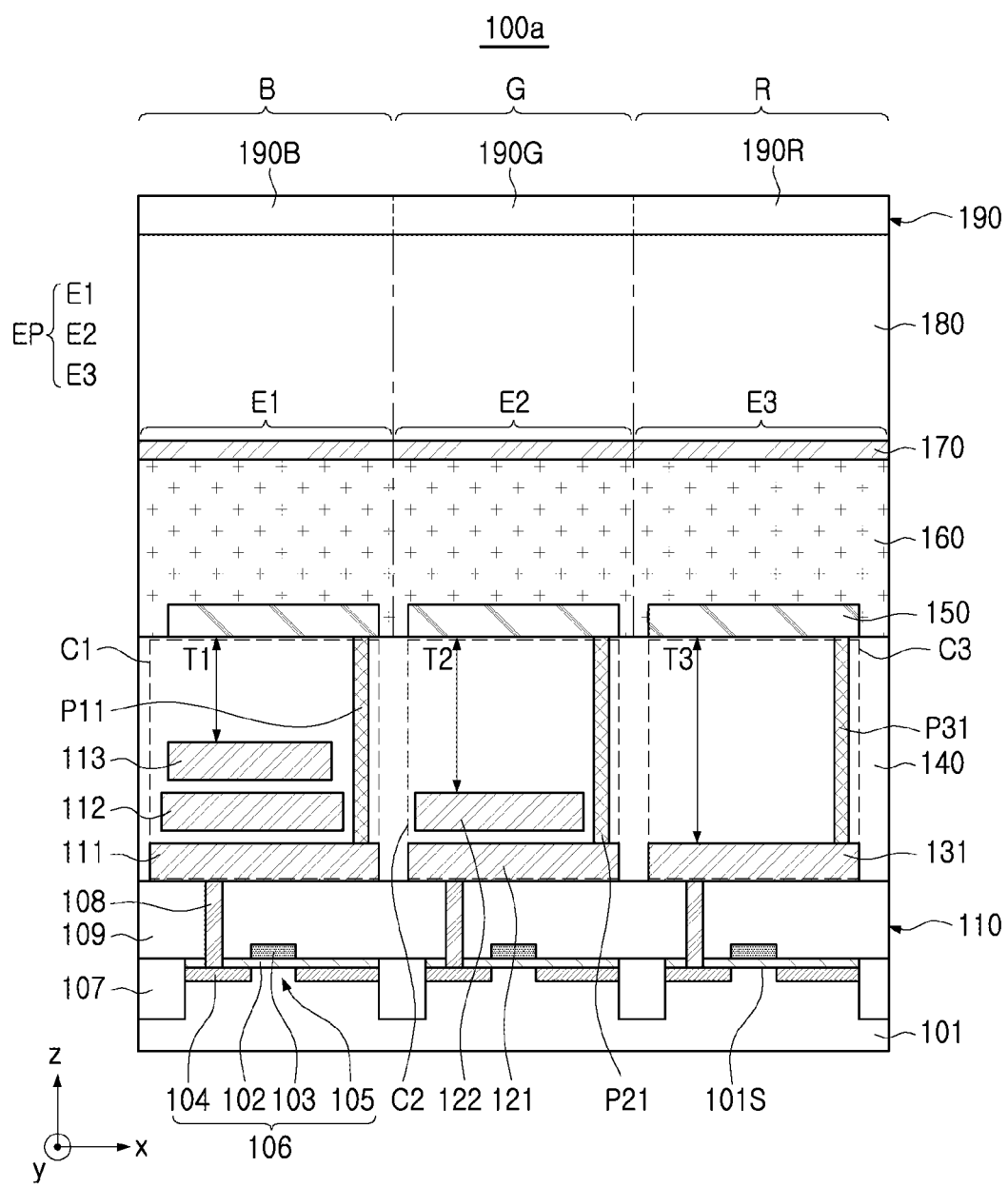
FIG. 2B is a cross-sectional diagram illustrating a light emitting device according to some example embodiments of the present inventive concept.

FIG. 1 is an exploded perspective diagram illustrating a light emitting device according to some example embodiments. FIG. 2A is a plan diagram illustrating a portion of a light emitting device viewing in a direction of arrow (A) according to some example embodiments. FIG. 2B is a cross-sectional diagram illustrating a light emitting device illustrated in FIG. 1 taken along line I-I' according to some example embodiments.

Referring to FIGS. 1, 2A, and 2B, a light emitting device 100a may include a substrate 101, a circuit region 110 on the substrate 101, an insulating layer 140 on the circuit region 110, a light emitting portion EP on the insulating layer 140, an encapsulation layer 180 on the light emitting portion EP, and color filters 190 on the encapsulation layer 180. The light emitting portion EP may include first electrodes 150, a light emitting layer 160, and a second electrode 170, but example embodiments thereof are not limited thereto.

The substrate 101 may have an upper surface 101S extending in an x direction and a y direction. The x direction and the y direction may be parallel to the upper surface 101S of the substrate, and may intersect each other in a horizontal plane as shown in FIG. 1. The substrate 101 may be configured as a silicon wafer substrate formed using a semiconductor process. The substrate 101 may include, for example, a group IV semiconductor, a group III-V compound semiconductor, and/or a group II-VI compound semiconductor. For example, a group IV semiconductor may include silicon, germanium, and/or silicon-gallium. The substrate 101 may be provided as a bulk wafer, an epitaxial layer, a silicon on insulator (SOI) layer, and/or a semiconductor on insulator (SeOI) layer, or the like.

The circuit region 110 may be disposed on the substrate 101. The circuit region 110 may include circuit devices 106, circuit contact plugs 108, and a circuit region insulating layer 109. The circuit devices 106 may include driver transistors, and the driver transistors may be MOSFETs, for example, but example embodiments thereof are not limited thereto. Each of the circuit devices 106 may include a gate insulating layer 102, a gate electrode 103, source/drain regions 104, and a channel region 105. Each of the circuit devices 106 may be isolated from each other by a device separation region 107 disposed between the circuit devices 106.

The gate insulating layer 102 may be disposed on the substrate 101. The gate insulating layer 102 may include an oxide, a nitride, and/or a high-k material. A high-k material may refer to a dielectric material having a dielectric constant higher than that of a silicon oxide film ($SiO_2$). The high-k material may include one or materials, such as, but not limited to, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and/or praseodymium oxide ($Pr_2O_3$).

The gate electrode 103 may be disposed on the gate insulating layer 102. The gate electrode 103 may include a conductive material. For example, the gate electrode 103 may include a metal nitride material, such as a titanium nitride film (TiN), a tantalum nitride film (TaN), and/or a tungsten nitride film (WN), and/or a metal material, such as aluminum (Al), tungsten (W), and/or molybdenum (Mo), and/or a semiconductor material, such as a doped polysilicon. The gate electrode 103 may include multiple layers, including two or more layers.

The source/drain regions 104 may be disposed in the substrate 101 on both sides of the gate electrode 103. The source/drain regions 104 may be configured as a semiconductor layer including silicon (Si), and may include different types of and/or different concentrations of impurities.

The channel region 105 may be disposed in the substrate 101 below the gate electrode 103. The channel region 105 may be connected to the source/drain regions 104. The channel region 105 may be formed of a semiconductor material. For example, the channel region 105 may include one or more materials selected from silicon (Si), germanium (Ge), and/or silicon-germanium (SiGe).

Each of the circuit contact plugs 108 may have an inclined lateral surface, a width of a lower portion of which is narrower than a width of an upper portion, in accordance with an aspect ratio, but example embodiments thereof are not limited thereto. The circuit contact plugs 108 may be in physical contact with the source/drain regions 104, which may be recessed into the substrate 101, and may be in physical contact with upper surfaces of the source/drain regions 104 to conform to the upper surfaces thereof. The circuit contact plugs 108 may include a metal nitride material, such as a titanium nitride film (TiN), a tantalum nitride film (TaN), and/or a tungsten nitride film (WN), and/or a metal material, such as aluminum (Al), tungsten (W), and/or molybdenum (Mo), or the like.

The circuit region insulating layer 109 may be disposed on the circuit device 106 on the substrate 101. The circuit contact plugs 108 may penetrate the circuit region insulating layer 109 and may be electrically connected to the source/drain regions 104. In a region not illustrated, the circuit contact plugs 108 may also be connected to the gate electrode 103.

Although not illustrated, the circuit region 110 may further include gate lines and data lines intersecting the gate lines. The gate lines may be connected a gate driver and may be supplied with gate signals. The data lines may be connected to a data driver and may be supplied with data voltages.

Each of the driver transistors, including the circuit devices 106, may supply a certain voltage to electrodes of the light emitting region in accordance with a data voltage of a data line when a gate signal is input from a gate line. For example, a gate signal may be input from a gate line, the driver transistor may operate based on a voltage of a data line, and a certain voltage may be supplied to each of the first electrodes 150 disposed on the driver transistor.

The light emitting device 100a in the example embodiment may include a plurality of pixels P. A single pixel P may include three consecutive sub-pixels SP in one direction, an x direction, for example. The sub-pixels SP may emit light having different wavelength ranges. For example, the three consecutive sub-pixels SP may emit red light, green light, and blue light, respectively. A single pixel P, including the three sub-pixels SP emitting red light, green light, and blue light, may emit white light as a whole.

The light emitting device 100a in the example embodiment may include driver transistors corresponding to the sub-pixels SP included in the plurality of pixels P on the substrate 101 in which a display region having the plurality of pixels P is defined, light emitting regions E1, E2, and E3, and light emitting region connecting portions C1, C2, and C3. As the driver transistor has already been described above, the light emitting regions E1, E2, and E3 and the light emitting region connecting portions C1, C2, and C3 will be described. In the description below, the insulating layer 140 providing a space in which the light emitting region connecting portions C1, C2, and C3 are interposed between the circuit region 110 and the light emitting regions E1, E2, and E3 will be described.

The insulating layer 140 may be disposed on the circuit region 110, and may be disposed below the light emitting regions E1, E2, and E3. The insulating layer 140 may cover the light emitting region connecting portions C1, C2, and C3. For example, the insulating layer 140 may be on and at least partially cover a portion of an upper surface of the circuit region insulating layer 109. The insulating layer 140 may have an upper surface parallel to the upper surface 101S of the substrate 101. The upper surface of the insulating layer 140 may be a substantially planar surface, but example embodiments thereof are not limited thereto.

The insulating layer 140 may have a resonant cavity structure. A resonant cavity structure may refer to a structure in which a resonance phenomenon occurs when light emitted from a light emitting layer is reflected from light reflective layers disposed below the light emitting layer and is repeatedly reflected between the light reflective layers and the second electrode 170, such that constructive interference occurs and the light is amplified. By having such a resonant cavity structure, the strength of light having a desired wavelength may be amplified by constructive interference of light and amplified light may be emitted. Accordingly, light extracting efficiency of a light emitting device may improve. Some embodiments of the inventive concept may also provide other features, such as, luminance for light having a desired wavelength may increase, light having a wavelength satisfying certain conditions may be enhanced, and light having a wavelength, which does not satisfy the conditions may be offset. Accordingly, a spectrum may narrow, such that color purity may improve, and light emitting efficiency may improve. Also, due to an increase of luminance, a light emitting device may be driven at a low current, such that a light emitting device having generally low power consumption may be provided.

Light emitted from the light emitting portion EP may be transmitted through the insulating layer 140, which may include a material having a high transmission rate, so as to provide a resonant cavity structure. The driver transistors corresponding to the sub-pixels SP, respectively, may control the light emitting regions E1, E2, and E3 through via plugs, respectively. Accordingly, the insulating layer 140 in which the via plugs are disposed may include an insulating material to insulate the via plugs from each other. The insulating layer 140 may be formed of, for example, an insulating material having high transmissivity, such as silicon oxide, but example embodiments thereof are not limited thereto.

The first light emitting region connecting portion C1, the second light emitting region connecting portion C2, and the third light emitting region connecting portion C3 may be disposed in the insulating layer 140. The first to third light emitting region connecting portions C1, C2, and C3 may correspond to the sub-pixels SP described above. Each of the first to third light emitting region connecting portions C1, C2, and C3 may include a plurality of light reflective layers and at least one or more via plugs.

The first light emitting region connecting portion C1 may include a first lower light reflective layer 111 on the circuit region 110, a first intermediate light reflective layer 112 on the first lower light reflective layer 111, and a first upper light reflective layer 113 on the first intermediate light reflective layer 112. The first lower light reflective layer 111, the first intermediate light reflective layer 112, and the first upper light reflective layer 113 may be referred to as first light reflective layers 111, 112, and 113. The first light reflective layers 111, 112, and 113 may have a multilayer structure in which the first light reflective layers are disposed vertically in the insulating layer 140 and are spaced apart from one another as shown in the cross-sectional view of FIG. 2B. The first light reflective layers 111, 112, and 113 may be covered by the insulating layer 140, and the insulating layer 140 may be disposed among the first light reflective layers 111, 112, and 113. For example, the insulating layer 140 may cover an upper surface and lateral surfaces of the first lower light reflective layer 111, and may cover an upper surface, a lower surface, and lateral surfaces of each of the first intermediate light reflective layer 112 and the first upper light reflective layer 113. However, example embodiments thereof are not limited thereto. In another example embodiment, a dispositional relationship between the insulating layer 140 and the first light reflective layers 111, 112, and 113 may be different.

In an example embodiment, each of the first light reflective layers 111, 112, and 113 may have an upper surface substantially parallel to the upper surface 101S of the substrate 101. The first light reflective layers 111, 112, and 113 may have different widths in one direction, the x direction, for example. The first lower light reflective layer 111 may extend farther than the first intermediate light reflective layer 112 in a direction parallel to the upper surface 101S of the substrate 101. For example, the first lower light reflective layer 111 may extend farther than the first intermediate light reflective layer 112 in the x direction. An area of an upper surface of the first lower light reflective layer 111 may be greater than an area of an upper surface of the first intermediate light reflective layer 112. The first intermediate light reflective layer 112 may extend farther than the first upper light reflective layer 113 in a direction parallel to the upper surface 101S of the substrate 101. For example, the first intermediate light reflective layer 112 may extend farther than the first upper light reflective layer 113 in the x direction. An area of an upper surface of the first intermediate light reflective layer 112 may be greater than an area of an upper surface of the first upper light reflective layer 113. An upper surface of the first lower light reflective layer 111 may oppose a lower surface of the first intermediate light reflective layer 112, and an upper surface of the first intermediate light reflective layer 112 may oppose a lower surface of the first upper light reflective layer 113.

The second light emitting region connecting portion C2 may include a second lower light reflective layer 121 on the circuit region 110, and a second upper light reflective layer 122 on the second lower light reflective layer 121. The second lower light reflective layer 121 and the second upper light reflective layer 122 may be referred to as second light reflective layers 121 and 122. The second light reflective layers 121 and 122 may have a multilayer structure in which the second light reflective layers are disposed vertically in the insulating layer 140 and spaced apart from each other as shown in the cross-sectional view of FIG. 2B. The second light reflective layers 121 and 122 may be covered by the insulating layer 140. For example, the insulating layer 140 may cover an upper surface and lateral surfaces of the second lower light reflective layer 121, and may cover an upper surface, a lower surface, and lateral surfaces of the second upper light reflective layer 122. However, example embodiments thereof are not limited thereto. In example embodiments, a dispositional relationship between the insulating layer 140 and the second light reflective layers 121 and 122 may be different.

In an example embodiment, each of the second light reflective layers 121 and 122 may have an upper surface substantially parallel to the upper surface 101S of the substrate 101. The second light reflective layers 121 and 122 may have different widths in one direction, the x direction, for example. The second lower light reflective layer 121 may extend farther than the second upper light reflective layer 122 in a direction parallel to the upper surface 101S of the substrate 101. For example, the second lower light reflective layer 121 may extend farther than the second upper light reflective layer 122 in the x direction. An area of an upper surface of the second lower light reflective layer 121 may be greater than an area of an upper surface of the second upper light reflective layer 122. An upper surface of the second lower light reflective layer 121 may oppose a lower surface of the second upper light reflective layer 122.

The third light emitting region connecting portion C3 may include a third light reflective layer 131 on the circuit region 110. The insulating layer 140 may cover an upper surface and lateral surfaces of the third light reflective layer 131, but an example embodiment thereof is not limited thereto.

The first and second lower light reflective layers 111 and 121 and the third light reflective layer 131 may be electrically connected to the driver transistors, respectively. For example, the first and second lower light reflective layer 111 and 121 and the third light reflective layer 131 may be electrically connected to the source/drain regions 104 through the circuit contact plugs 108, respectively.

A thickness of each of the first to third light reflective layers 111, 112, 113, 121, 122, and 131 may have a value ranging from about 20 nm to about 300 nm, but the thickness may be varied in example embodiments. For example, a thickness of each of the first to third light reflective layers 111, 112, 113, 121, 122, and 131 may be within a range from about 30 nm to about 70 nm.

The first to third light reflective layers 111, 112, 113, 121, 122, and 131 may reflect light emitted from the light emitting portion EP. A plurality of beams of light emitted from the light emitting portion EP may be reflected from the first and second upper light reflective layers 113 and 122 and the third light reflective layer 131. As the first and second upper light reflective layers 113 and 122 and the third light reflective layer 131 may be disposed on different levels in a z direction perpendicular to the upper surface 101S of the substrate 101, and portions of the insulating layer 140 from upper surfaces of the first and second upper light reflective layers 113 and 122 and the third light reflective layer 131 to an upper surface of the insulating layer 140 may have different thicknesses, the insulating layer 140 may have a resonant cavity structure. For example, the insulating layer 140 may have a first thickness T1 from an upper surface of the first upper light reflective layer 113 in the z direction, may have a second thickness T2 greater than the first thickness T1 from an upper surface of the second upper light reflective layer 122 in the z direction, and may have a third thickness T3 greater than the second thickness T2 from an upper surface of the third light reflective layer 131 in the z direction. Each of the first to third thicknesses T1, T2, and T3 may have a value ranging from about 50 nm to about 900 nm. For example, the first thickness T1 may be within a range from about 70 nm to about 90 nm, the second thickness T2 may be within a range from about 160 nm to about 200 nm, and the third thickness T3 may be within a range from about 260 nm to about 300 nm, but example embodiments thereof are not limited thereto. The insulating layer 140 may have the first to third thicknesses T1, T2, and T3 based on a resonant cavity structure of each sub-pixel SP. The first to third thicknesses T1, T2, and T3 may vary in accordance with a wavelength of light emitted from each of the sub-pixels SP.

In the light emitting device in the example embodiment, the first to third thicknesses T1, T2, and T3 of the insulating layer 140 may be configured based on the resonant cavity structures of the respective sub-pixels SP, respectively. Accordingly, the strength of light having a desired wavelength may be amplified by constructive interference of light and the amplified light may be emitted, such that light extracting efficiency of the light emitting device may improve. Also, as luminance for light having a desired wavelength may increase, only light having a wavelength satisfying certain conditions may be enhanced, and a wavelength which does not satisfy conditions may be offset. As a result, a light spectrum may become narrow, such that color purity may improve, and light emitting efficiency may improve. Also, due to an increase of luminance, a light emitting device may be driven at a low current, such that a light emitting device having low power consumption may be provided.

At least one of the first to third light reflective layers 111, 112, 113, 121, 122, and 131 may include a plurality of layers having different widths with respect to each other and may be disposed vertically as shown in the cross-sectional view of FIG. 2B. For example, the first light reflective layers 111, 112, and 113 may include a plurality of layers having different widths with respect to each other and disposed vertically as shown in the cross-sectional view of FIG. 2B, and the plurality of layers in the example embodiment may be configured as the first lower light reflective layer 111, the first intermediate light reflective layer 112, and the first upper light reflective layer 113, having different widths with respect to each other, but example embodiments thereof are not limited thereto. In other example embodiments, the plurality of layers may have widths decreasing from lower layers to upper layers, may be spaced apart from each other vertically, and may be in physical contact with each other, but example embodiments thereof are not limited thereto.

The first to third light reflective layers 111, 112, 113, 121, 122, and 131 may each include a metal material having high reflectivity, and may each include the same metal material or different metal materials with respect to each other. For example, the first to third light reflective layers 111, 112, 113, 121, 122, and 131 may include aluminum (Al) or silver (Ag), but example embodiments thereof are not limited thereto.

The first light emitting region connecting portion C1 may include a first connection via plug P11 connected to the first light emitting region E1. The first connection via plug P11 may be connected to the first lower light reflective layer 111. The first connection via plug P11 may be disposed in the insulating layer 140, and may be connected to the first electrode 150 on the insulating layer 140. The first connection via plug P11 may have a width decreasing downwardly (in the cross-sectional view of FIG. 2B) in accordance with an aspect ratio. The first connection via plug P11 may be disposed in a region at which the first lower light reflective layer 111 does not overlap the first intermediate light reflective layer 112 as illustrated in the example in the plan view diagram of FIG. 2A. The first connection via plug P11 may be disposed on an edge of the first lower light reflective layer 111, but example embodiments thereof are not limited thereto. The first connection via plug P11 may be disposed at any region at which the first lower light reflective layer 111 does not overlap the first intermediate light reflective layer 112. For example, the first connection via plug P11 may be disposed adjacent to a corner of an upper surface of the first lower light reflective layer 111.

The second light emitting region connecting portion C2 may include a second connection via plug P21 connected to the second light emitting region E2. The second connection via plug P21 may be connected to the second lower light reflective layer 121. The second connection via plug P21 may be disposed in the insulating layer 140, and may be connected to the first electrode 150 on the insulating layer 140. The second connection via plug P21 may have a width decreasing downwardly in accordance with an aspect ratio as shown in the cross-sectional view of FIG. 2B. The second connection via plug P21 may be disposed in a region at which the second lower light reflective layer 121 does not overlap the second upper light reflective layer 122 as illustrated in the example in the plan view diagram of FIG. 2A. The second connection via plug P21 may be disposed on an edge of the second lower light reflective layer 121, but example embodiments thereof are not limited thereto. The second connection via plug P21 may be disposed at any region at which the second lower light reflective layer 121 does not overlap the second upper light reflective layer 122. For example, the second connection via plug P21 may be disposed adjacent to a corner of an upper surface of the second lower light reflective layer 121.

The third light emitting region connecting portion C3 may include a third connection via plug P31 connected to the third light reflective layer 131. The third connection via plug P31 may be disposed in the insulating layer 140, may extend in the z direction, and may be connected to the first electrodes 150. The third connection via plug P31 may have a width decreasing downwardly in accordance with an aspect ratio as shown in the cross-sectional view of FIG. 2B. The third connection via plug P31 may be disposed adjacent to an edge or a corner of an upper surface of the third light reflective layer 131 as illustrated in the example in the plan view diagram of FIG. 2A.

As the light emitting region connecting portions C1, C2, and C3 include the connection via plugs P11, P21, and P31, respectively, an area of the light reflective layer from which light emitted from the light emitting portion EP is reflected may increase, and light extracting efficiency may improve.

A width of each of the first to third connection via plugs P11, P21, and P31 may have a value ranging from about 0.1 μm to about 1 μm. The first to third connection via plugs P11, P21, and P31 may be formed in the same process, i.e., may be formed at the same time using common fabrication operations, and may have substantially the same width. However, example embodiments thereof are not limited thereto, and a width of each of the first to third connection via plugs P11, P21, and P31 may vary in example embodiments.

In an example embodiment, the first to third connection via plugs P11, P21, and P31 may include a conductive material, such as tungsten (W) or copper (Cu) used in a semiconductor process, but example embodiments thereof are not limited thereto. Generally, via plugs may be formed of indium tin oxide (ITO) in a process of manufacturing a display device. However, as the light emitting device in the example embodiment is manufactured in a semiconductor process, the via plugs may be formed of a metal material, such as tungsten (W). As a size of each pixel of the light emitting device decreases, a size of each via hole may also decrease, and by depositing tungsten (W) in the via holes having a reduced size, voids may be reduced or prevented, such that a light emitting device having improved reliability may be provided.

The first to third connection via plugs P11, P21, and P31 may include a conductive material, may be electrically connected to the first lower light reflective layer 111, the second lower light reflective layer 121, and the third light reflective layer 131, respectively, and may be electrically connected to the circuit devices 106 through the circuit contact plugs 108 connected to the first lower light reflective layer 111, the second lower light reflective layer 121, and the third light reflective layer 131, respectively. Accordingly, the circuit devices 106 operating by voltages applied to a gate line and data line may provide a voltage to the first electrodes 150 through the first to third connection via plugs P11, P21, and P31.

In an example embodiment, the first electrodes 150, the light emitting layer 160, and the second electrode 170 may be included in the light emitting portion EP. The light emitting portion EP may provide a region in which holes injected from the first electrodes 150 and electrons injected from the second electrode 170 are transported into the light emitting layer 160 and may form exciton, and when the exciton transitions from an excited state to a ground state, light may be generated and emitted in a form of visible light. The light emitting portion EP may include the first light emitting region E1, the second light emitting region E2, and the third light emitting region E3 for each sub-pixel SP. The first to third light emitting regions E1, E2, and E3 may be disposed on the insulating layer 140, and each of the first to third light emitting regions E1, E2, and E3 may include the first electrodes 150, the light emitting layer 160, and the second electrode 170. The first light emitting region E1 may be disposed on the first light emitting region connecting portion C1, and may be connected to the first lower light reflective layer 111 through the first connection via plug P11. The second light emitting region E2 may be disposed on the second light emitting region connecting portion C2, and may be connected to the second lower light reflective layer 121 through the second connection via plug P21. The third light emitting region E3 may be disposed on the third light emitting region connecting portion C3, and may be connected to the third light reflective layer 131 through the third connection via plug P31.

The first electrodes 150 may be on and at least partially cover a portion of an upper surface of the insulating layer 140, and may be connected to the above-described via plugs P11, P13, P21, P22, and P31, respectively. The first electrodes 150 may be disposed on substantially the same level on the insulating layer 140. The first electrodes 150 may include a transparent conductive material. For example, the first electrodes 150 may include one or more materials, such as, indium tin oxide (ITO), tin oxide (TO), indium zinc oxide (IZO), and/or indium tin zinc oxide (ITZO), but example embodiments thereof are not limited thereto.

The light emitting layer 160 may be on and at least partially cover an upper surface and a lateral surface of each of the first electrodes 150, and may be on and at least partially cover a portion of an upper surface of the insulating layer 140 in a region in which the first electrodes 150 do not overlap the insulating layer 140 in, for example, the z direction. An upper surface of the light emitting layer 160 may have a curved shape due to difference thicknesses of the insulating layer 140. The light emitting layer 160 may be configured as a common layer disposed in the pixels P in common. The light emitting layer 160 may be configured as a single layer formed of a light emitting material, or may include multiple layers including a hole injection layer, a hole transporting layer, an emitting material layer, an electron transporting layer, and/or an electron injection layer to improve light emitting efficiency. The hole injection layer may facilitate the injection of holes from the first electrodes 150 into the light emitting layer 160. The hole transporting layer may transport holes to the emitting material layer and may also reduce or prevent electrons generated from the second electrode 170 from moving to the emitting material layer, such that light emitting efficiency may improve. The electron injection layer may facilitate the injection of electrons. The electron transporting layer may transport electrons to the emitting material layer. The emitting material layer may emit white light. The emitting material layer may include a plurality of layers including a red light emitting layer, a green light emitting layer, and a blue light emitting layer stacked therein. The light emitting device 100a in the example embodiment may include the light emitting layer 160 in which at least one type of layer selected from types of layers including the hole injection layer, the hole transporting layer, the emitting material layer, the electron transporting layer, and/or the electron injection layer is not provided.

The second electrode 170 may be on and at least partially cover an upper surface of the light emitting layer 160. The second electrode 170 may be configured as a common layer disposed in the pixels P in common. The second electrode 170 may include magnesium (Mg), calcium (Ca), aluminum (Al), silver (Ag), and/or alloys thereof, having a low work function, and may further include an auxiliary electrode and/or a bus electrode line formed of a material for a transparent electrode, such as indium tin oxide (ITO), indium zinc oxide (IZO), or the like. For example, the second electrode 170 may be formed of an alloy of magnesium and silver (Mg:Ag), such that the second electrode 170 may have transflective properties. Light emitted from the emitting material layer may be externally displayed through the second electrode 170. As the second electrode 170 may have transflective properties, a portion of light may be reflected from the second electrode 170 and may be directed to the first electrodes 150 or the light reflective layers 130.

The encapsulation layer 180 may be on and at least partially cover an upper surface of the second electrode 170. An upper surface of the encapsulation layer 180 may be in parallel to an upper surface of the substrate 101. The encapsulation layer 180 may reduce or prevent permeation of oxygen or moisture into the light emitting layer 160 and the second electrode 170.

The color filters 190 may be on and at least partially cover an upper surface of the encapsulation layer 180. The color filters 190 may include a red color filter 190R, a green color filter 190G, and a blue color filter 190B. The red color filter 190R may selectively transmit red light (wavelength: 620 nm to 750 nm) of light emitted from the light emitting layer 160. The green color filter 190G may selectively transmit green light (wavelength: 495 nm to 570 nm) of light emitted from the light emitting layer 160. The blue color filter 190B may selectively transmit blue light (wavelength: 450 nm to 490 nm) of light emitted from the light emitting layer 160.

The first light emitting region connecting portion C1, a portion of the insulating layer 140 covering the first light emitting region connecting portion C1, the first light emitting region E1 connected to the first connection via plug P11 on the first light emitting region connecting portion C1, and the blue color filter 190B may overlap one another in a direction perpendicular to the upper surface 101S of the substrate 101 (e.g., the z direction), and may be defined as a blue sub-pixel B. The second light emitting region connecting portion C2, a portion of the insulating layer 140 covering the second light emitting region connecting portion C2, the second light emitting region E2 connected to the second connection via plug P21 on the second light emitting region connecting portion C2, and the green color filter 190G may overlap one another in a direction perpendicular to the upper surface 101S of the substrate 101 (e.g., the z direction), and may be defined as a green sub-pixel G. The third light emitting region connecting portion C3, a portion of the insulating layer 140 covering the third light emitting region connecting portion C3, the third light emitting region E3 connected to the third connection via plug P31 on the third light emitting region connecting portion C3, and the red color filter 190R may overlap one another in a direction perpendicular to the upper surface 101S of the substrate 101 (e.g., the z direction), and may be defined as a red sub-pixel R. The red sub-pixel R may emit red light, the green sub-pixel G may emit green light, and the blue sub-pixel B may emit blue light.

In the description below, a modified example of a light emitting device will be described with reference to FIGS. 3A to 10.

Figure 3A:
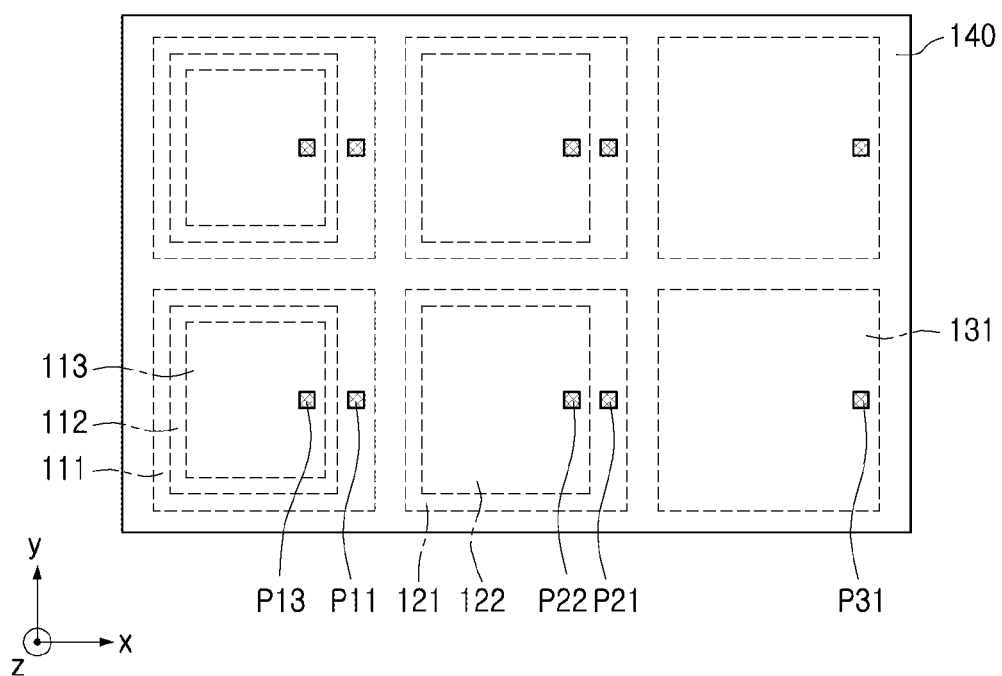
FIG. 3A is a plan diagram illustrating a portion of a light emitting device according to some example embodiments of the present inventive concept.
Figure 3B:
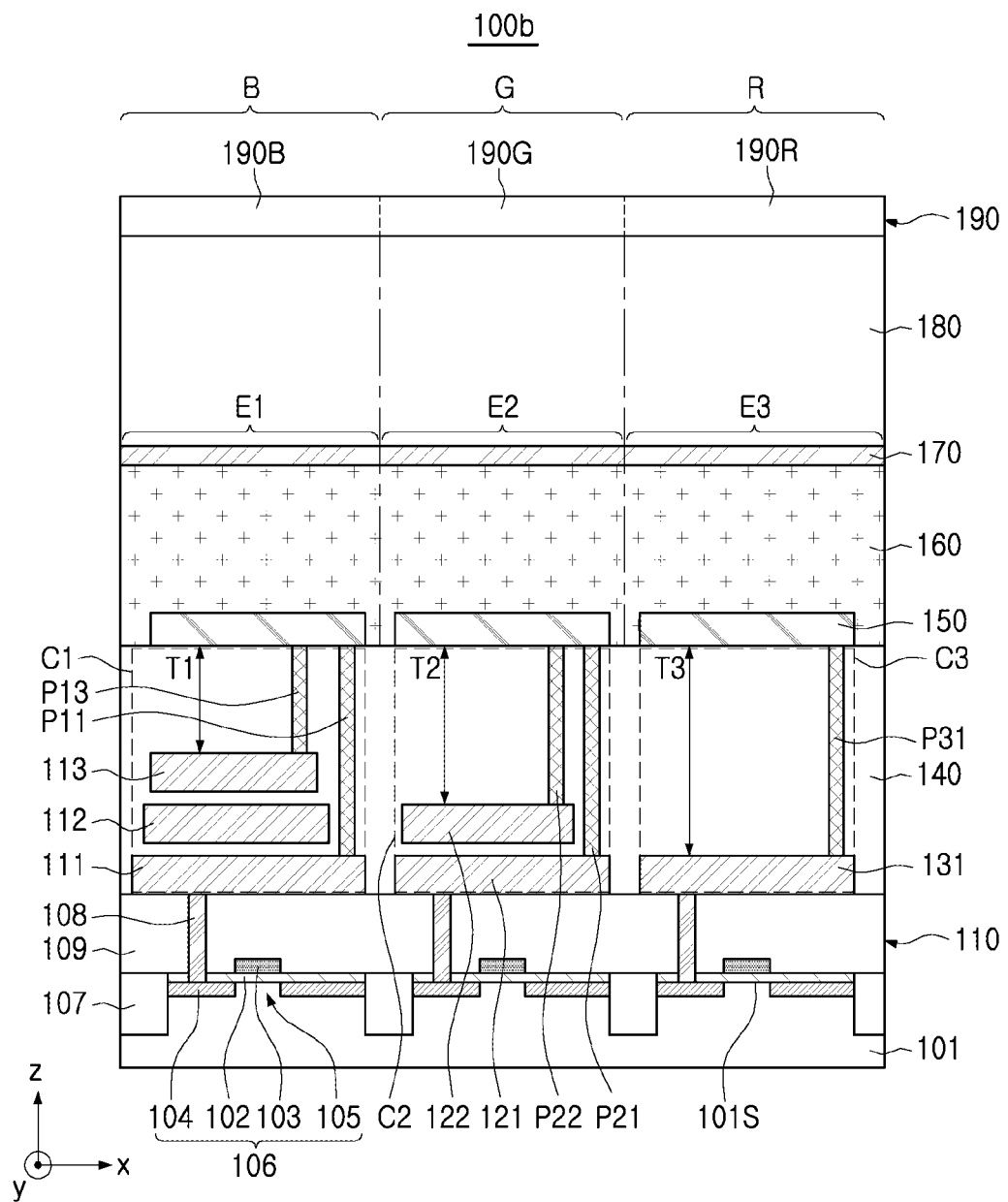
FIG. 3B is a cross-sectional diagram illustrating a light emitting device according to some example embodiments of the present inventive concept.

FIG. 3A is a plan diagram illustrating a light emitting device viewed in a direction of an arrow (A) (see, FIG. 1) according to some example embodiments. FIG. 3B is a cross-sectional diagram illustrating a light emitting device illustrated in FIG. 1 taken along line I-I' according to some example embodiments.

Referring to FIGS. 3A and 3B, in a light emitting device 100b, a first light emitting region connecting portion C1 may include at least one or more first via plugs connected to a first light emitting region E1, in contrast to the example embodiment illustrated in FIGS. 2A and 2B. One of the first via plugs may be configured as a first connection via plug P11 connected to a first lower light reflective layer 111, and another one may be configured as a first via plug P13 connected to a first upper light reflective layer 113. The first via plug P13 may be disposed adjacent to an edge or a corner of an upper surface of the first upper light reflective layer 113 as illustrated in the example in the plan view diagram of FIG. 2A, but example embodiments thereof are not limited thereto. The first via plug P13 may be disposed at any position on the first upper light reflective layer 113. The first connection via plug P11 and the first via plug P13 may be disposed on the same linear position in the x direction, but example embodiments thereof are not limited thereto, and the first connection via plug P11 and the first via plug P13 may also be disposed on different linear positions in the x direction. In the light emitting device 100b, a second light emitting region connecting portion C2 may include one or more second via plugs connected to a second light emitting region E2, in contrast to the example embodiment illustrated in FIGS. 2A and 2B. One of the second via plugs may be configured as a second connection via plug P21 connected to a second lower light reflective layer 121, and another one may be configured as a second via plug P22 connected to a second upper light reflective layer 122. The second via plug P22 may be disposed adjacent to an edge or a corner of an upper surface of the first upper light reflective layer 113 as illustrated in the example in the plan view diagram of FIG. 2A, but example embodiments thereof are not limited thereto, and the second via plug P22 may be disposed at any position on the second upper light reflective layer 122. The second connection via plug P21 and the second via plug P22 may be disposed on the same linear position in the x direction, but example embodiments thereof are not limited thereto. The second connection via plug P21 and the second via plug P22 may be disposed on different linear positions in the x direction.

Figure 4A:
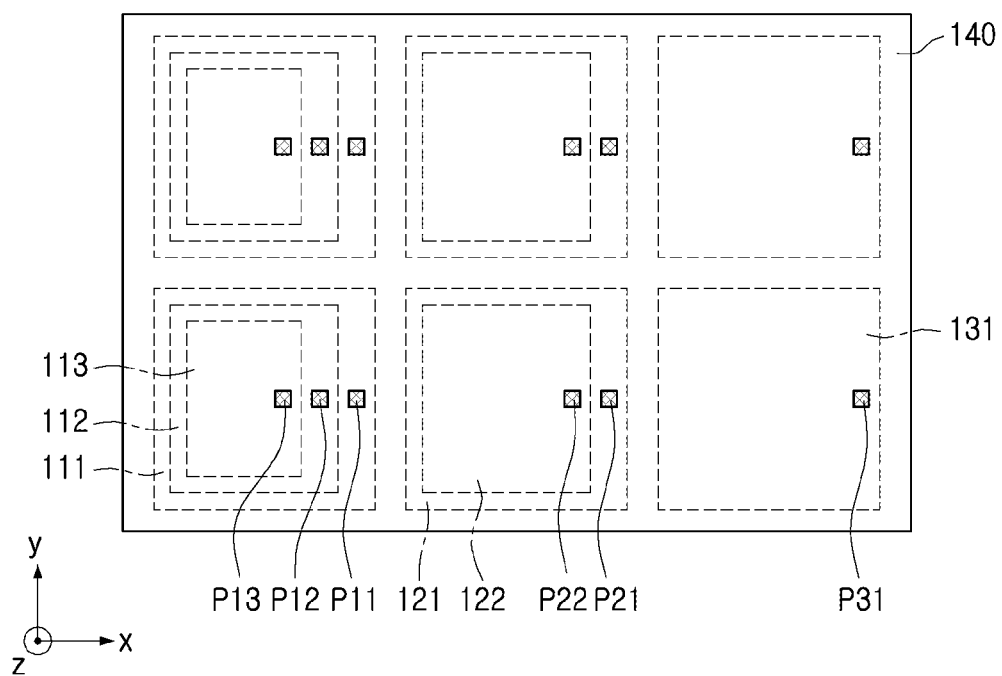
FIG. 4A is a plan diagram illustrating a portion of a light emitting device according to some example embodiments of the present inventive concept.
Figure 4B:
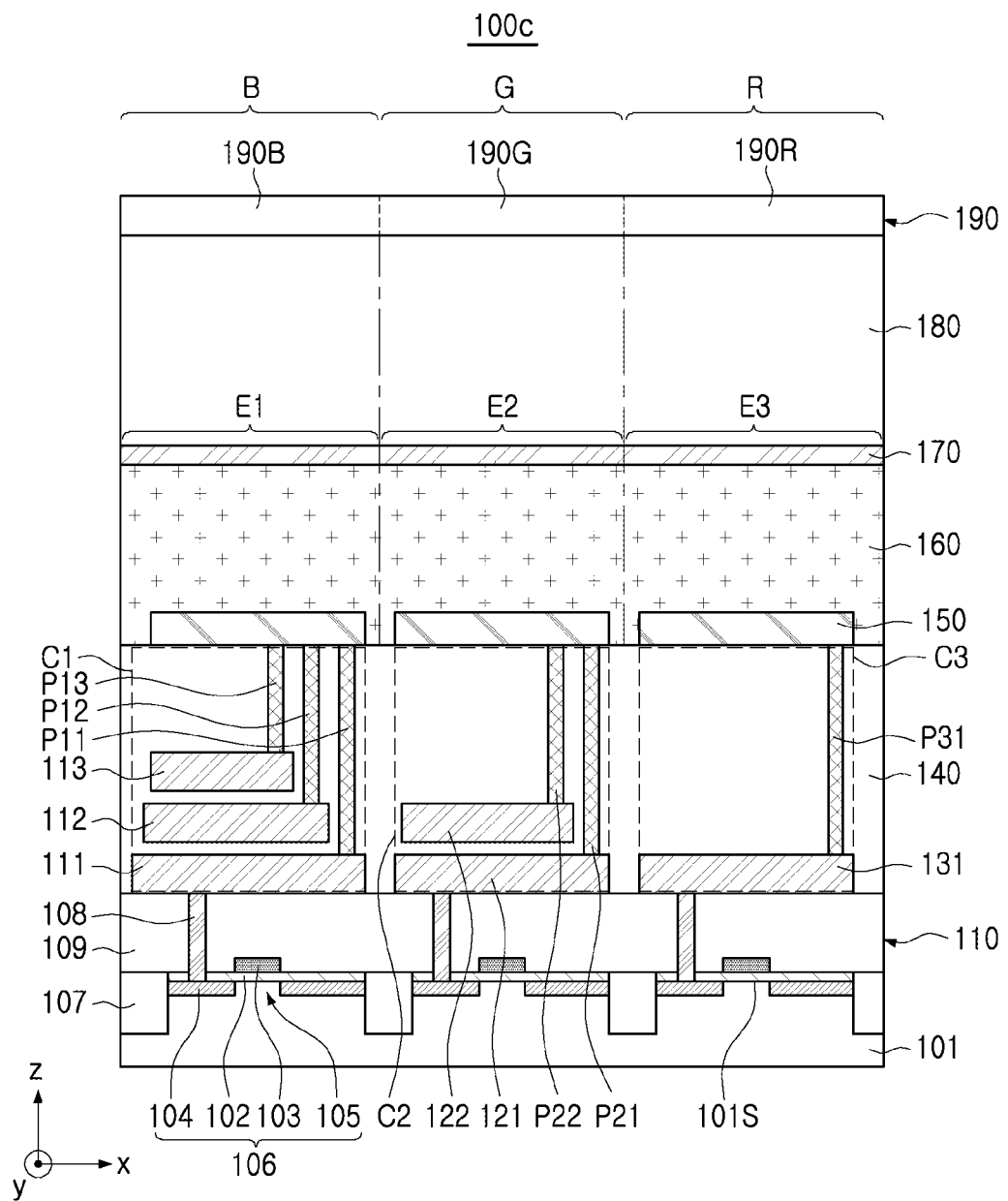
FIG. 4B is a cross-sectional diagram illustrating a light emitting device according to some example embodiments of the present inventive concept.

FIG. 4A is a plan diagram illustrating a light emitting device illustrated in FIG. 1 viewing in a direction of arrow (A) (see, FIG. 1) according to some example embodiments. FIG. 4B is a cross-sectional diagram illustrating a light emitting device along line I-I' according to some example embodiments.

Referring to FIGS. 4A and 4B, in a light emitting device 100c, a first light emitting region connecting portion C1 may include one or more first via plugs, and the one or more first via plugs may be connected to a first lower light reflective layer 111, a first intermediate light reflective layer 112, and a first upper light reflective layer 113, respectively, in contrast to the example embodiments illustrated in FIGS. 3A and 3B. One of the three first via plugs may be configured as a first connection via plug P11 connected to the first lower light reflective layer 111, and the others may be configured as a first via plug P12 connected to a first intermediate light reflective layer 112, and a first via plug P13 connected to the first upper light reflective layer 113, respectively. The first connection via plug P11 may be disposed at a region at which the first lower light reflective layer 111 does not overlap the first intermediate light reflective layer 112 as illustrated in the example in the plan view diagram of FIG. 4A, and the first via plug P12 may be disposed at a region at which the first intermediate light reflective layer 112 does not overlap the first upper light reflective layer 113 as illustrated in the example in the plan view diagram of FIG. 4A. The first connection via plug P11 and the first via plug P12 and P13 may be disposed adjacent to edges or corners of upper surfaces of the first lower light reflective layer 111, the first intermediate light reflective layer 112, and the first upper light reflective layer 113, respectively. A width of the first via plug P12 may have an approximate value ranging from about 0.1 μm to A width of the first via plug P12 may vary in example embodiments. The first via plug P12 may include a conductive material, such as tungsten (W) and/or copper (Cu), but example embodiments thereof are not limited thereto. As the light emitting device 100c further includes the first via plug P12 in contrast to the example embodiment illustrated in FIGS. 3A and 3B, an area of an upper surface of the first upper light reflective layer 113 may be reduced.

Figure 5A:
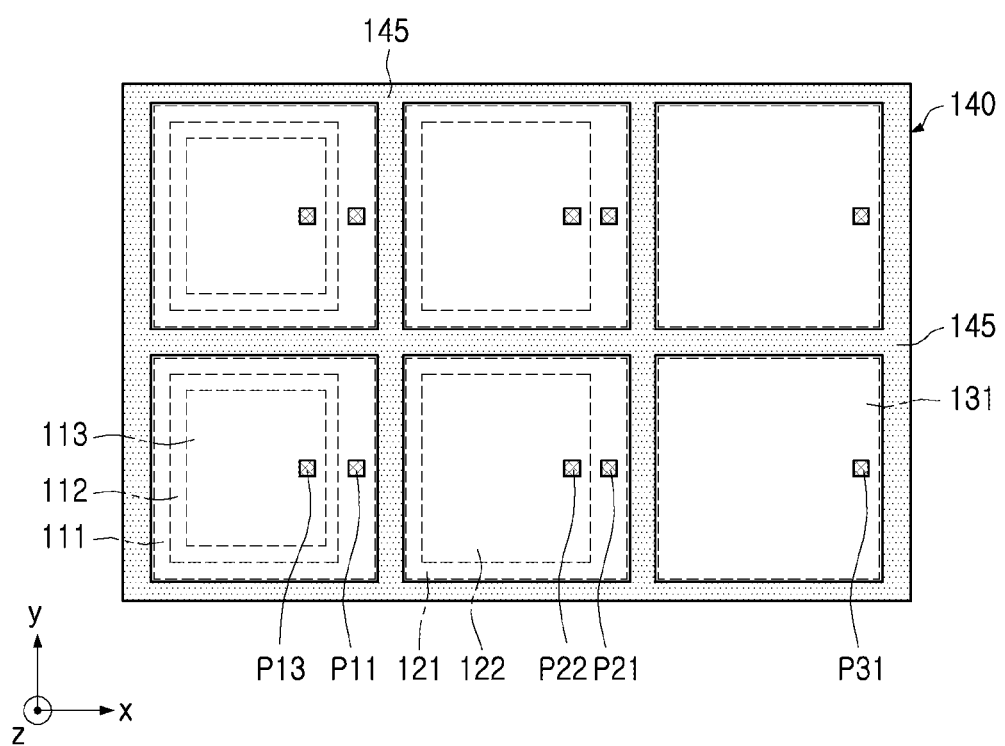
FIG. 5A is a plan diagram illustrating a portion of a light emitting device according to some example embodiments of the present inventive concept.
Figure 5B:
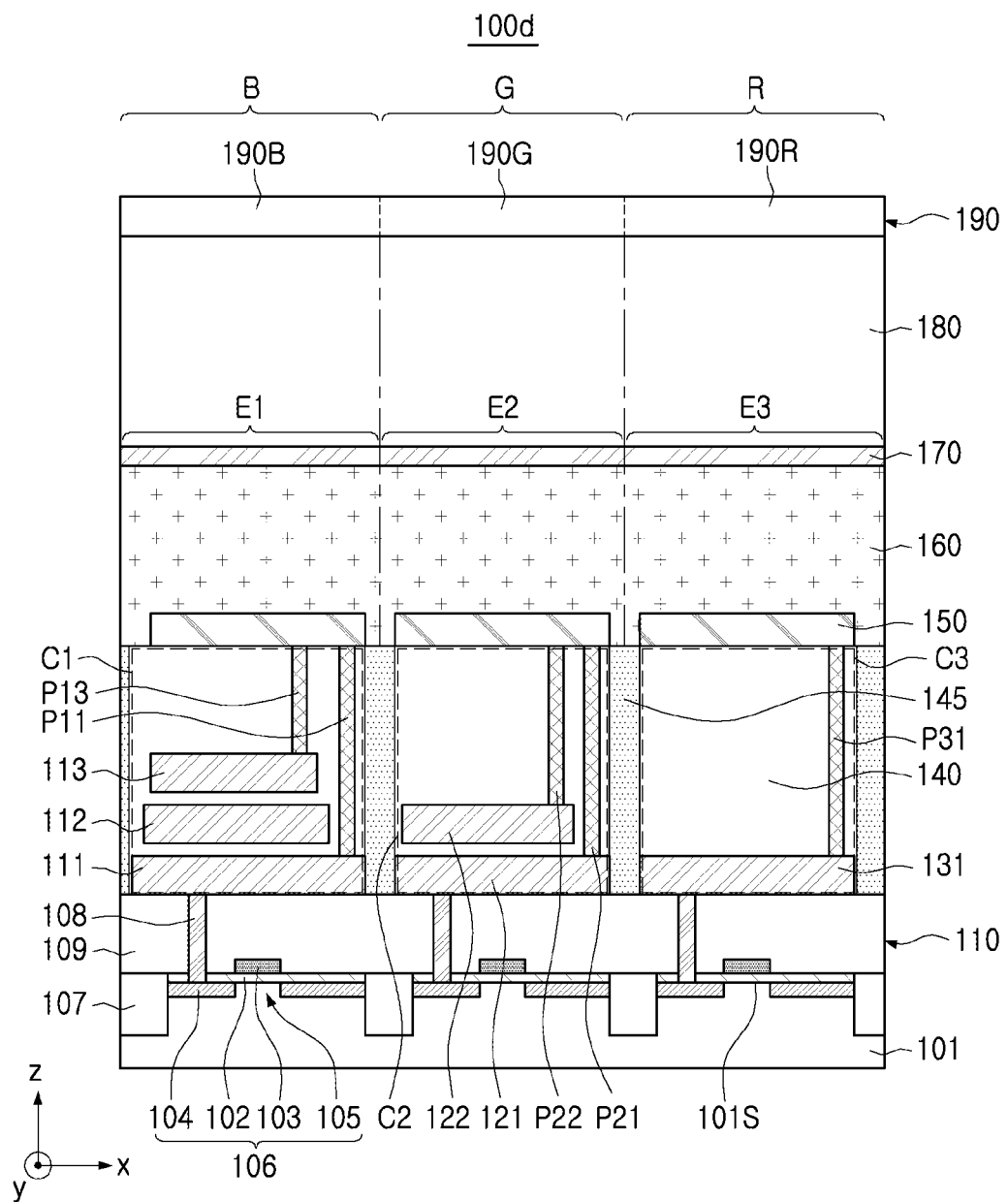
FIG. 5B is a cross-sectional diagram illustrating a light emitting device according to some example embodiments of the present inventive concept.

FIG. 5A is a plan diagram illustrating a light emitting device illustrated in FIG. 1 viewing in a direction of the arrow (A) (see FIG. 1) according to some example embodiments. FIG. 5B is a cross-sectional diagram illustrating a light emitting device illustrated in FIG. 1 taken along line I-I' according to some example embodiments.

Referring to FIGS. 5A and 5B, a light emitting device 100d may further include a separation insulating layer 145 disposed among a first light emitting region connecting portion C1, a second light emitting region connecting portion C2, and a third light emitting region connecting portion C3, and extending in the z direction perpendicular to an upper surface 101S of a substrate 101. The separation insulating layer 145 may be disposed in an insulating layer 140, and may separate the light emitting region connecting portions C1, C2, and C3 from one another. The separation insulating layer 145 may extend to a region between a first lower light reflective layer 111 and a second lower light reflective layer 121, and may also extend to a region between the second lower light reflective layer 121 and a third light reflective layer 131. The separation insulating layer 145 may extend in the x direction and may separate a plurality of pixels P from one another, and may also extend in the y direction and may separate sub-pixels SP from one another. The separation insulating layer 145 may include a material having low absorptivity and electrical insulating properties. The separation insulating layer 145 may include silicon oxide, silicon oxynitride, and/or silicon nitride, for example. In another example embodiment, the separation insulating layer 145 may include a material having light reflective properties. The separation insulating layer 145 may be configured to block light among the first to third light emitting region connecting portions C1, C2, and C3, such that beams of light transmitted to or reflected from the light reflective layers in the insulating layer 140 may not interfere with one another. Accordingly, luminance for light having a desired wavelength may increase and color purity may improve, such that a light emitting device having improved light emitting efficiency may be provided.

Figure 6A:
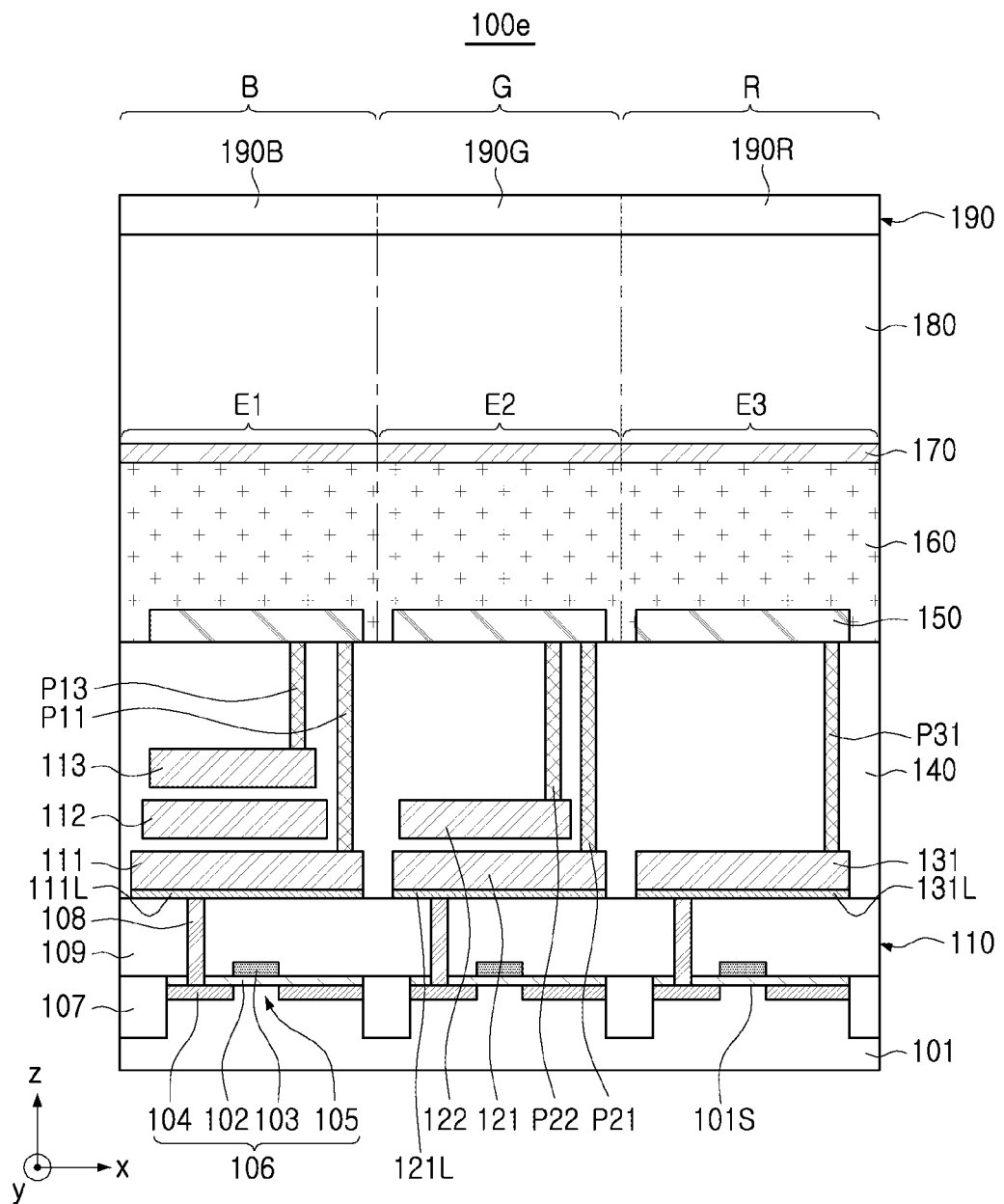
FIGS. 6A to 8 are cross-sectional diagrams illustrating a light emitting device according to some example embodiments of the present inventive concept.
Figure 6B:
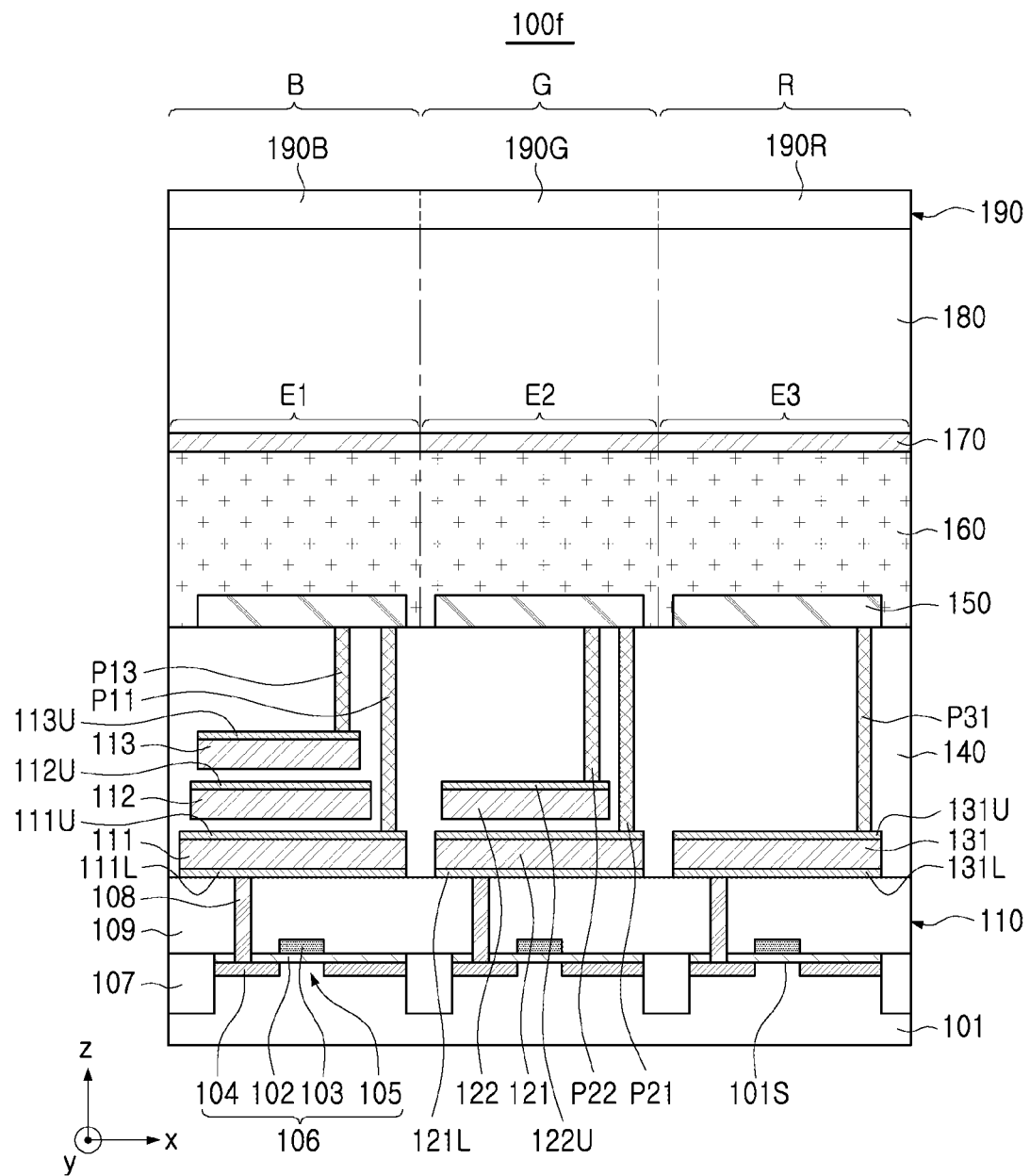

FIGS. 6A and 6B are cross-sectional diagrams illustrating a light emitting device illustrated in FIG. 1 along line I-I' according to some example embodiments.

Referring to FIG. 6A, a light emitting device 100e may further include lower buffer layers 111L, 121L, and 131L disposed below a first lower light reflective layer 111, a first intermediate light reflective layer 112, and a first upper light reflective layer 113, respectively, in contrast to the example embodiment illustrated in FIGS. 2A and 2B. The lower buffer layers 111L, 121L, and 131L may include a dual layer structure including titanium (Ti) and/or titanium nitride (TiN). The lower buffer layers 111L, 121L, and 131L may improve adhesive force between the first lower light reflective layer 111, the first intermediate light reflective layer 112, and the first upper light reflective layer 113 and circuit contact plugs 108 and may reduce contact resistance between metals.

Referring to FIG. 6B, a light emitting device 100f may further include upper buffer layers 111U, 121U, 131U, 112U, 113U, and 122U disposed on a first lower light reflective layer 111, a second lower light reflective layer 121, a third light reflective layer 131, a first intermediate light reflective layer 112, a first upper light reflective layer 113, and a second upper light reflective layer 122, respectively. The upper buffer layers 111U, 121U, 131U, 112U, 113U, and 122U may include titanium nitride (TiN). The upper buffer layers 111U, 121U, 131U, 112U, 113U, and 122U may increase adhesive force between and the reflective layers and via plugs and may protect the light reflective layers.

Figure 7A:
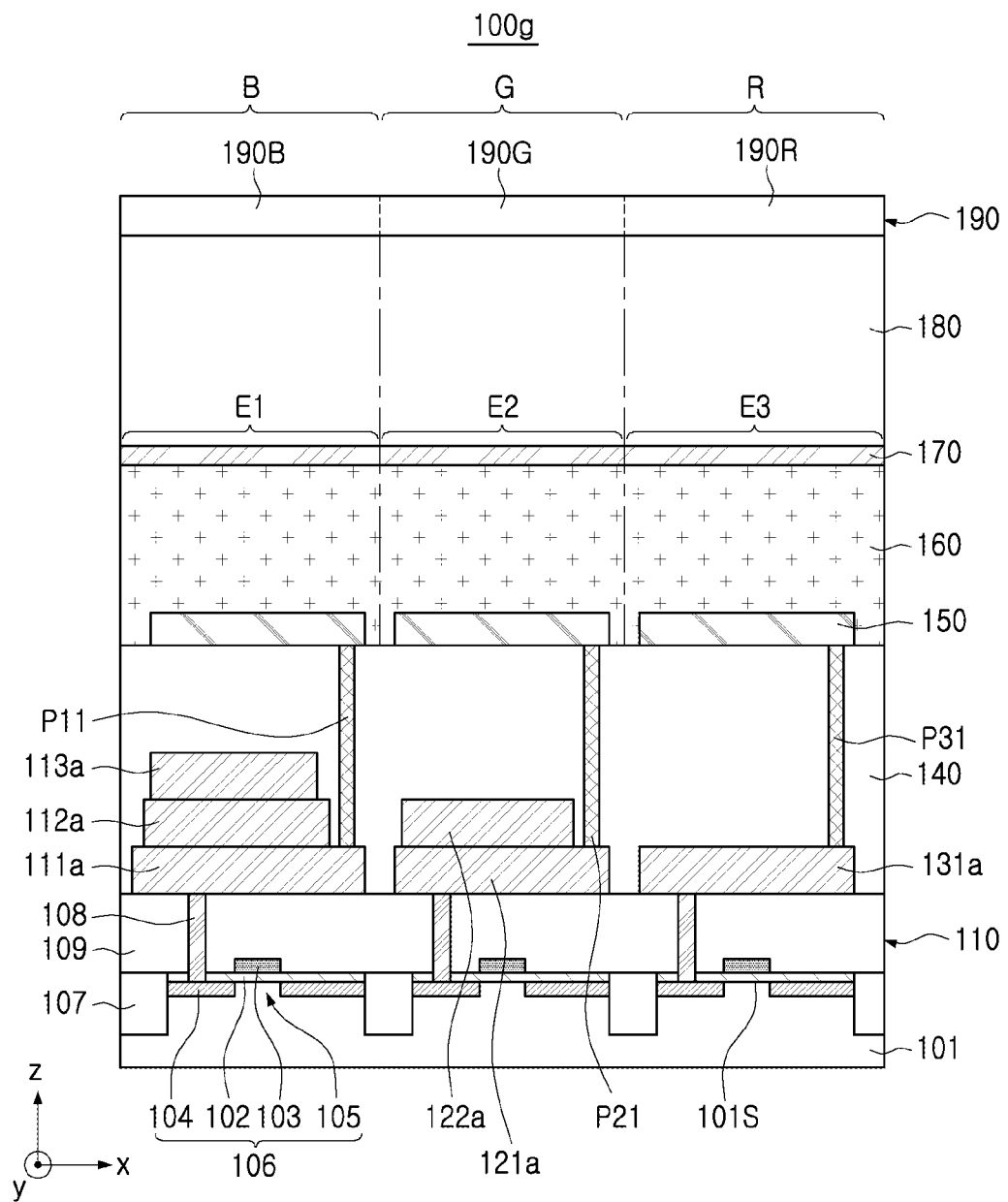
Figure 7B:
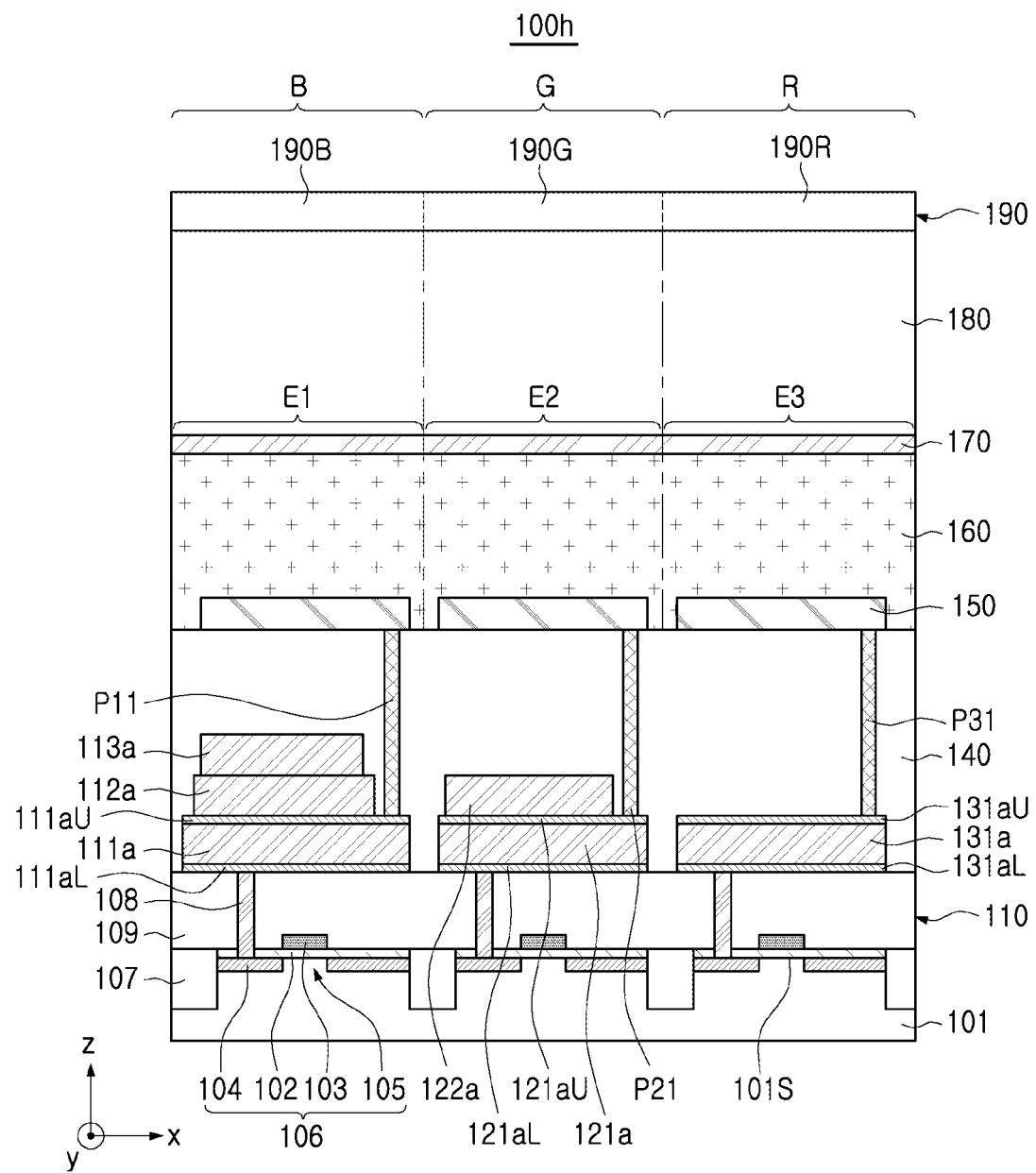

FIGS. 7A and 7B are cross-sectional diagrams illustrating a light emitting device illustrated in FIG. 1 taken along line according to some example embodiments.

Referring to FIG. 7A, in a light emitting device 100g, an insulating layer 140 may not be disposed among a first lower light reflective layer 111a, a first intermediate light reflective layer 112a, and a first upper light reflective layer 113a and between a second lower light reflective layer 121a and a second upper light reflective layer 122a, in contrast to the example embodiment illustrated in FIGS. 2A and 2B. The first lower light reflective layer 111a may be in physical contact with the first intermediate light reflective layer 112a, and the first intermediate light reflective layer 112a may be in physical contact with the first upper light reflective layer 113a, but example embodiments thereof are not limited thereto. The second lower light reflective layer 121a may be in physical contact with the second upper light reflective layer 122a, but example embodiments thereof are not limited thereto.

Referring to FIG. 7B, a light emitting device 100h may further include lower buffer layers 111aL, 121aL, and 131aL below a first lower light reflective layer 111a, a second lower light reflective layer 121a, and a third light reflective layer 131, respectively, and may further include upper buffer layers 111aU, 121aU, and 131aU on the first lower light reflective layer 111a, the second lower light reflective layer 121a, and the third light reflective layer 131, respectively, in contrast to the example embodiment illustrated in FIG. 7A. The lower buffer layers 111aL, 121aL, and 131aL and the upper buffer layers 111aU, 121aU, and 131aU may include titanium (Ti) and/or titanium nitride (TiN). The lower buffer layers 111aL, 121aL, and 131aL and the upper buffer layers 111aU, 121aU, and 131aU may protect light reflective layers, may increase adhesive force between metals, and may decrease contact resistance between metals.

Figure 8:
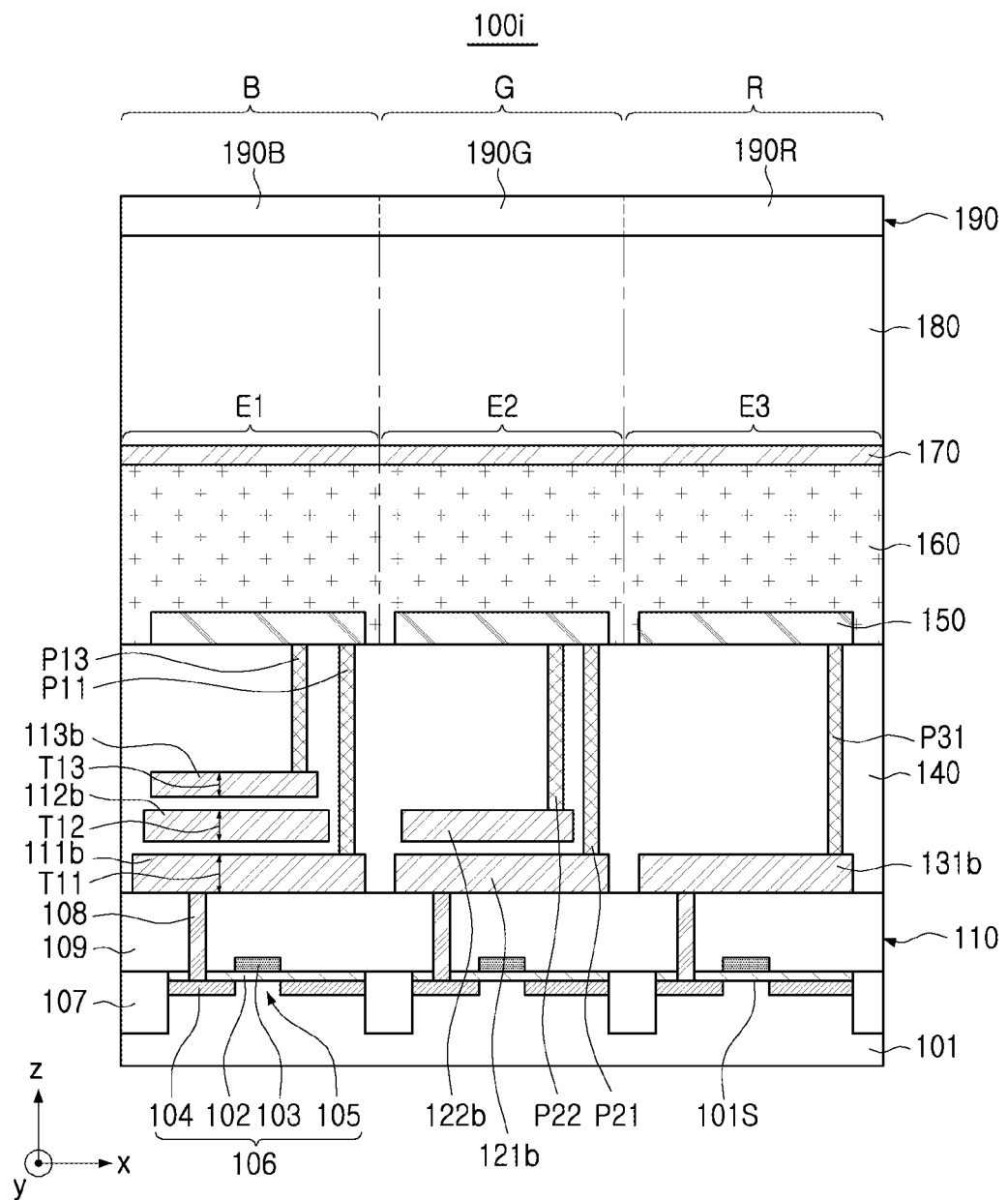

FIG. 8 is a cross-sectional diagram illustrating a light emitting device illustrated in FIG. 1 taken along line I-I' according to some example embodiments.

Referring to FIG. 8, in a light emitting device 100i, first light reflective layers 111b, 112b, and 113b may have different thicknesses, and second light reflective layers 121b and 122b may also have different thicknesses, in contrast to the example embodiment illustrated in FIGS. 2A and 2B. The first and second light reflective layers 111b, 112b, 113b, 121b, and 122b may have thicknesses decreasing from lower layers to upper layers in the cross-sectional view of FIG. 8. For example, the first lower light reflective layer 111b may have a first reflective layer thickness T11, the first intermediate light reflective layer 112b may have a second reflective layer thickness T12 thinner than the first reflective layer thickness T11, and the first upper light reflective layer 113b may have a third reflective layer thickness T13 thinner than the second reflective layer thickness T12. However, example embodiments thereof are not limited thereto, and a thickness of each of the first light reflective layers 111b, 112b, and 113b, the second light reflective layers 121b and 122b, and the third light reflective layer 131 131b may vary in example embodiments.

Figure 9:
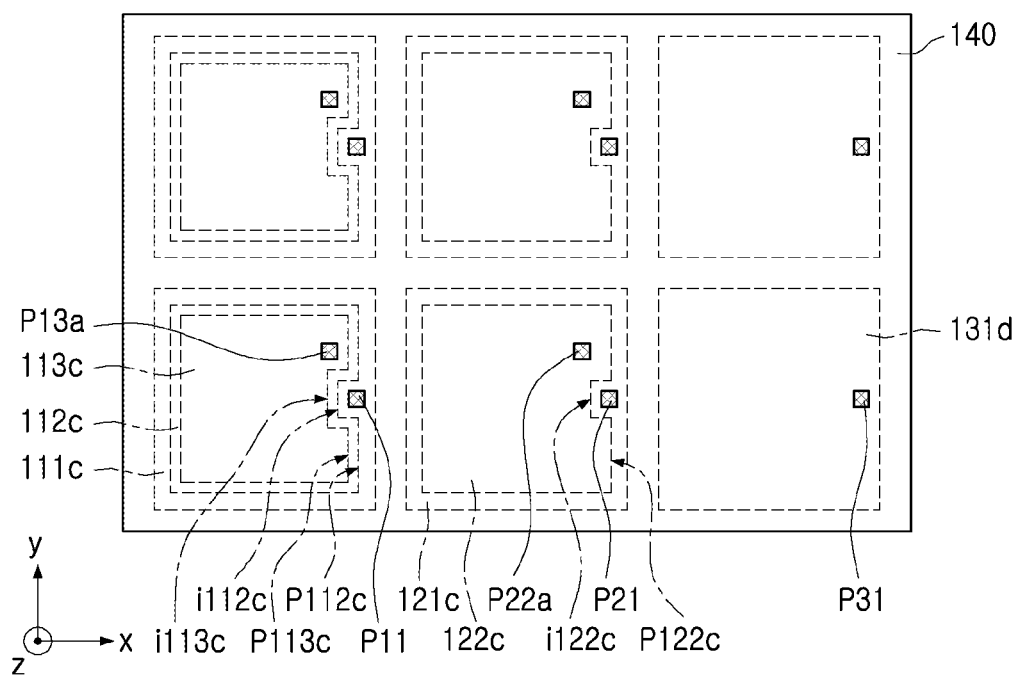
FIG. 9 is a plan diagram illustrating a portion of a light emitting device according to some example embodiments of the present inventive concept.

FIG. 9 is a plan diagram illustrating a light emitting device illustrated in FIG. 1 viewed in a direction of arrow (A) (see FIG. 1) according to some example embodiments.

Referring to FIG. 9, a shape of an upper surface of each of the light reflective layers may be different from the example embodiment illustrated in FIG. 2A, and may have serrations. The serrations may include a plurality of protrusions and a cut-out portion. A first intermediate light reflective layer 112c may include a plurality of first protrusions p112c and a first cut-out portion i112c between the plurality of first protrusions p112c on one surface adjacent to a first connection via plug P11. A third light reflective layer 131c may include a plurality of second protrusions p113c and a second cut-out portion i113c between the second protrusions p113c on one surface adjacent to the first connection via plug P11. A second upper light reflective layer 122c may include a plurality of third protrusions p122c and a third cut-out portion i122c between the third protrusions p122c on one surface adjacent to a second connection via plug P21. By including the first to third protrusions p112c, p113c, and p122c and the first to third cut-out portions i112c, i113c, and i122c, an area of an upper surface of the first upper light reflective layer 113c and an area of an upper surface of the second upper light reflective layer 122c may increase. Accordingly, light emitted from the light emitting portion may be reflected from the light reflective layer having a greater area and a resonant effect obtained by having a resonant cavity structure may increase, such that light extracting efficiency may improve. A shape of the upper surface of each of the light reflective layers is not limited to the example illustrated in FIG. 9, and may vary in example embodiments.

Figure 10:
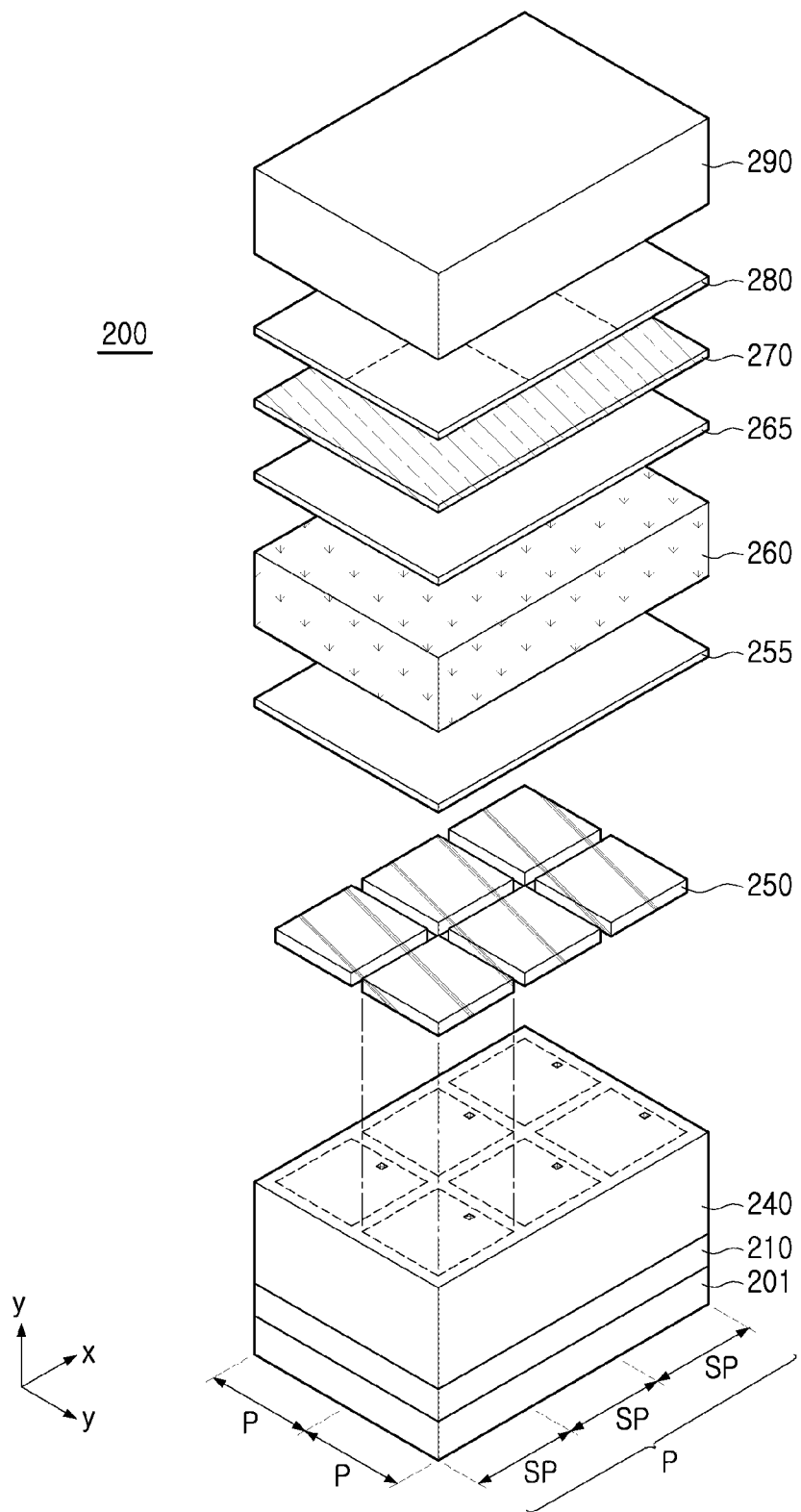
FIG. 10 is a perspective diagram illustrating a light emitting device according to example embodiments of the present inventive concept.

FIG. 10 is an exploded perspective diagram illustrating a light emitting device according to some example embodiments.

In contrast with the example illustrated in FIG. 1, FIG. 10 illustrates an example in which a light emitting device 200 is configured as a liquid crystal on silicon (LCoS) device.

The light emitting device 200 may include a substrate 201, a circuit region 210 on the substrate 201, an insulating layer 240 on the circuit region 210, an electrode layer 250 on the insulating layer 240, a lower alignment layer 255 on the electrode layer 250, a liquid crystal layer 260 on the lower alignment layer 255, an upper alignment layer 265 on the liquid crystal layer 260, a transparent electrode layer 270 on the upper alignment layer 265, a color filter 280 on the transparent electrode layer 270, and a glass substrate 290 on the color filter 280. A light source may be present external to the glass substrate 290, and light emitted from the light source may be transmitted into the light emitting device 200. The light may be reflected from a reflective layer of the light emitting device 200 and may be emitted external to the light emitting device 200. The light emitting device 200 may further include other elements in addition to the above-described elements, and a dispositional order of the elements may be varied.

Figure 11A:
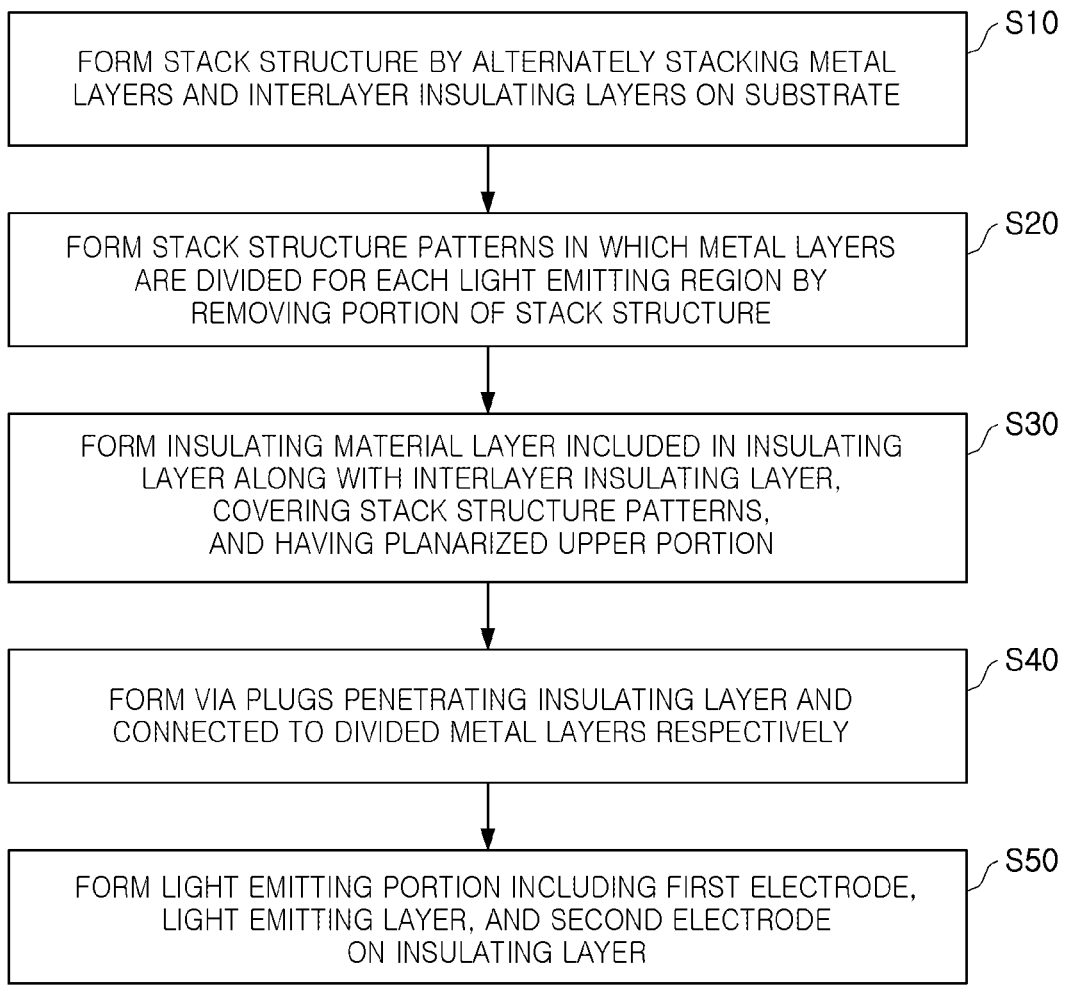
FIGS. 11A to 11C are flowcharts illustrating a method of manufacturing a light emitting device according to some example embodiments of the present inventive concept.
Figure 11B:
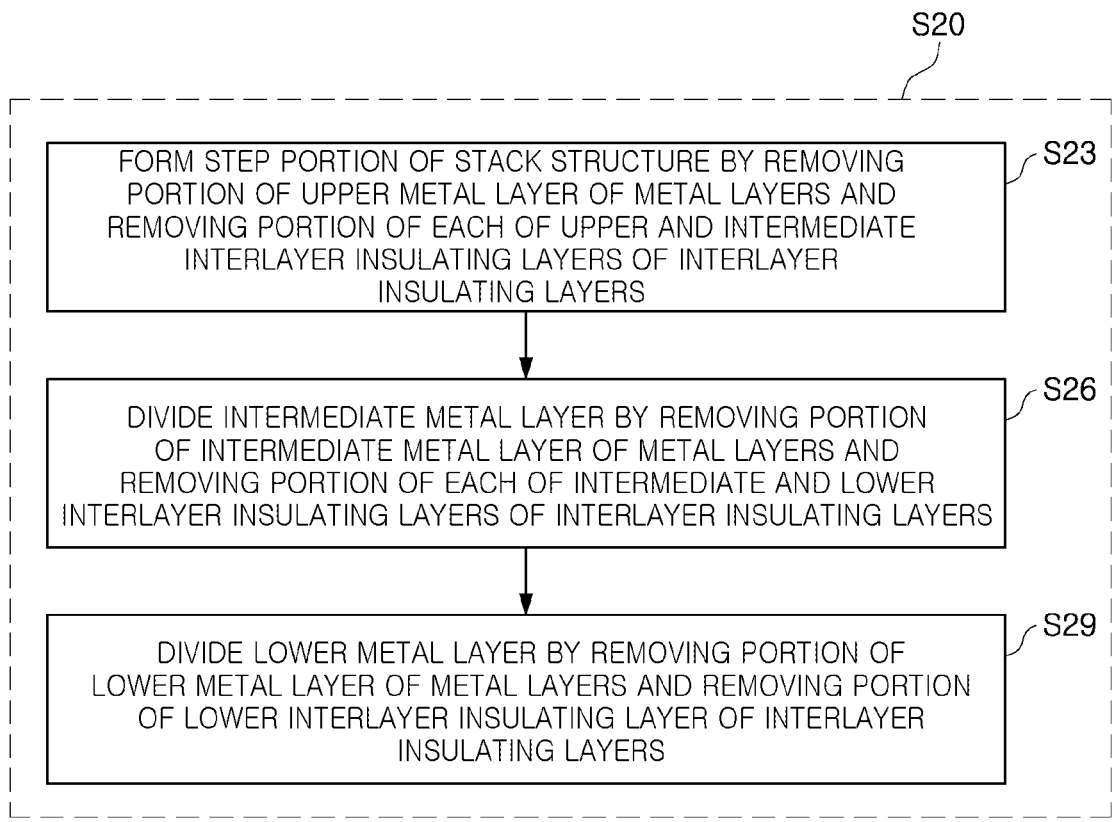
Figure 11C:
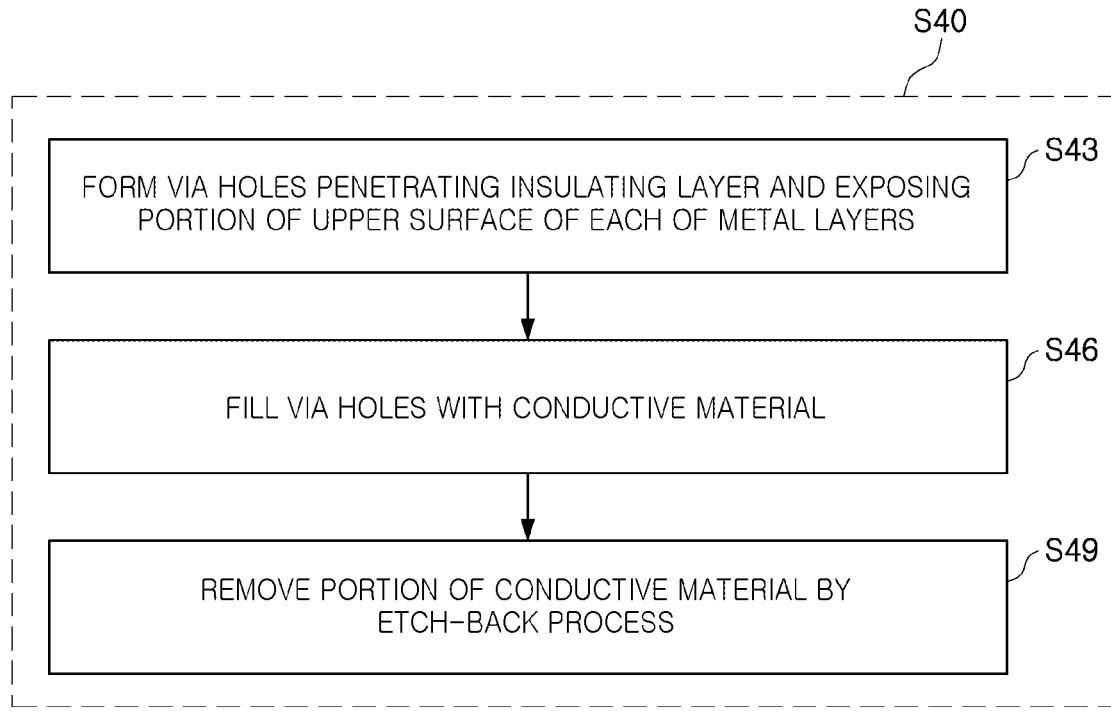

In the descriptions below, a method of manufacturing a light emitting device will be described in accordance with some example embodiments with reference to FIGS. 11A to 18. FIGS. 11A to 11C are flowcharts illustrating processes of a method of manufacturing a light emitting device according to some example embodiments, and FIGS. 12 to 18 are diagrams illustrating processes of a method of manufacturing a light emitting device according to further example embodiments.

Figure 12:
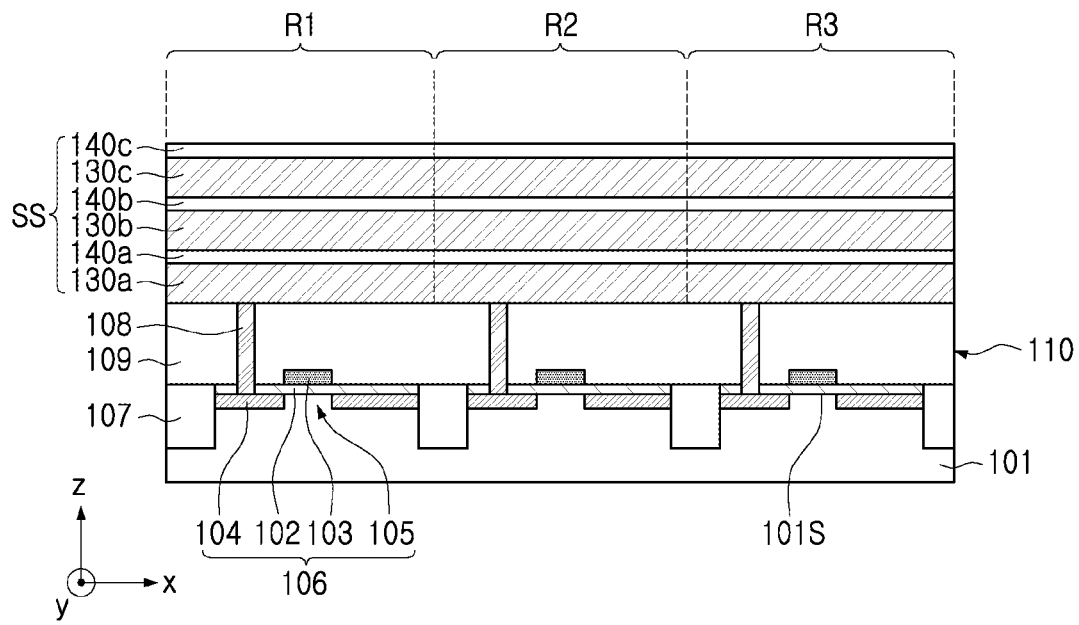
FIGS. 12 to 18 are diagrams illustrating a method of manufacturing a light emitting device according to some example embodiments of the present inventive concept.
Figure 13:
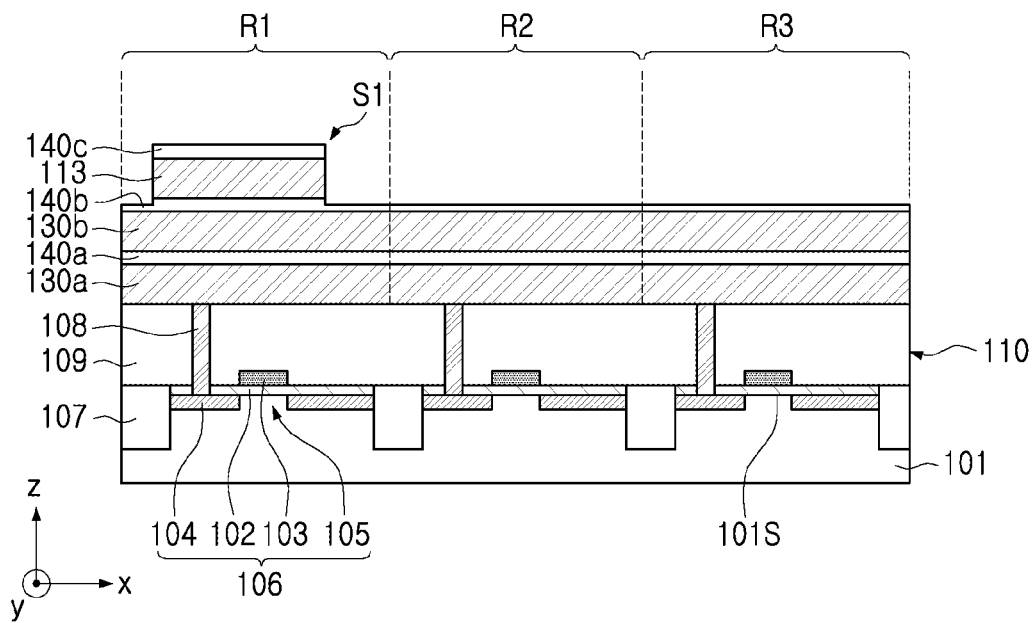

Referring to FIGS. 11A to 12, a substrate 101 may be prepared, and metal layers 130a, 130b, and 130c and interlayer insulating layers 140a, 140b, and 140c may be alternately stacked on the substrate 101, thereby forming a stack structure SS (S10). The metal layers 130a, 130b, and 130c may have substantially the same thickness, and the interlayer insulating layers 140a, 140b, and 140c may also have substantially the same thickness. In other example embodiments, the metal layers 130a, 130b, and 130c may have different thicknesses, may be stacked in a direction perpendicular to an upper surface 101S of the substrate 101 and may be spaced apart from one another. The stack structure SS may include a first region R1, a second region R2, and a third region R3 corresponding to the sub-pixels SP described with reference to FIG. 1.

A circuit region 110 may be formed on the substrate 101 before alternately stacking the metal layers 130a, 130b, and 130c and the interlayer insulating layers 140a, 140b, and 140c on the substrate 101. The circuit region 110 may include circuit devices 106, circuit contact plugs 108, and a circuit region insulating layer 109, and the circuit devices 106 may include a gate insulating layer 102, a gate electrode 103, source/drain regions 104, and a channel region 105.

In another example embodiment, a buffer layer may further be stacked between the metal layers 130a, 130b, and 130c and the interlayer insulating layers 140a, 140b, and 140c. For example, in some embodiments, a buffer layer may be formed below the lower metal layer 130a, in other embodiments, a buffer layer may also be formed on the lower metal layer 130a and below the lower interlayer insulating layer 140a, and a buffer layer may also be formed on the intermediate metal layer 130b.

Referring to FIGS. 11a and 11b, and FIGS. 13 to 15, stack structure patterns PP in which the metal layers 130a, 130b, and 130c are divided for each light emitting region may be formed by removing a portion of the stack structure SS (S20).

Referring to FIGS. 1, 11B, 12, and 13, a first step portion S1 of the stack structure SS may be formed by removing a portion of the upper metal layer 130c of the metal layers 130a, 130b, and 130c and a portion of each of the intermediate and upper interlayer insulating layers 140b and 140c of the interlayer insulating layers 140a, 140b, and 140c (S23). The first step portion S1 may be formed in the first region R1, and the upper metal layer 130c and the upper interlayer insulating layer 140c on the second and third regions R2 and R3 may be removed. In the process of forming the first step portion S1, a recess may be formed in the interlayer insulating layer 140b. The first step portion S1 may divide the upper metal layer 130c and a first upper light reflective layer 113 may be formed as illustrated in FIG. 2B and the other figures. The first step portion S1 in the first region R1 may include a lateral surface of the first upper light reflective layer 113 that is free of other layers or structures. As the first step portion S1 is also formed in an adjacent pixel P in the same process described above, a step portion including the other lateral surface of the first upper light reflective layer 113 that is free of other layers or structures and opposing the lateral surface of the first step portion S1 may be formed.

Figure 14:
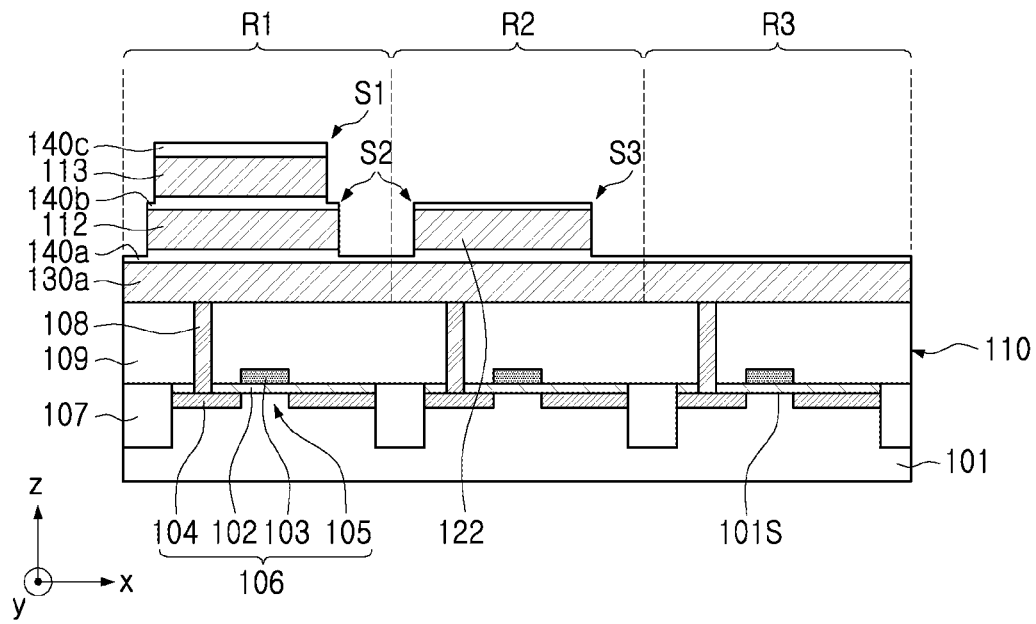

Referring to FIGS. 1, 11B, and 14, the interlayer insulating layer 140b may be divided by removing a portion of the interlayer metal layer 130b of the metal layers 130a, 130b, and 130c and removing a portion of each of the lower and intermediate interlayer insulating layers 140a and 140b of the interlayer insulating layers 140a, 140b, and 140c (S26). A second step portion S2 may be formed by removing a portion of the interlayer metal layer 130b and removing a portion of each of the lower and intermediate interlayer insulating layers 140a and 140b on an interfacial surface between the first and second regions R1 and R2, and a third step portion S3 may be formed by removing another portion of the interlayer metal layer 130b and removing other portions of the lower and intermediate interlayer insulating layers 140a and 140b in the second region R2. The interlayer metal layer 130b may be divided by the second and third step portions S2 and S3 and the first intermediate light reflective layer 112 and the second upper light reflective layer 122 may be formed. The interlayer metal layer 130b on the third region R3 may be removed by the third step portion S3, as illustrated in FIG. 2B. In the process of forming the second and third step portions S2 and S3, a recess may be formed in the upper interlayer insulating layer 140c. As the second and third step portions S2 and S3 are also formed in an adjacent pixel P in the same process described above, a step portion may also be formed on a second lateral surface of the first intermediate light reflective layer 112 opposing the first lateral surface on which the second step portion S2 is formed in the first region R1.

Figure 15:
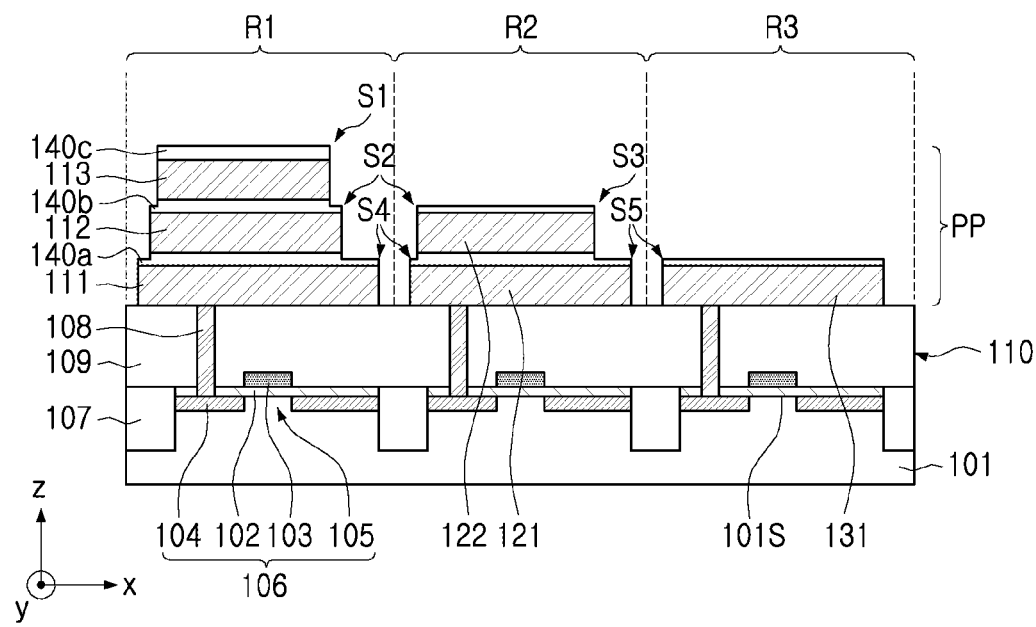

Referring to FIGS. 1, 11B, and 15, the lower metal layer 140a may be divided by removing a portion of the lower metal layer 130a of the metal layers 130a, 130b, and 130c and removing a portion of the lower interlayer insulating layer 140a of the interlayer insulating layers 140a, 140b, and 140c (S29). A fourth step portion S4 may be formed by removing a portion of the lower metal layer 130a and a portion of the lower interlayer insulating layer 140a adjacent to an interfacial surface between the first region and the second region R1 and R2, and a fifth step portion S5 may be formed by removing another portion of the lower metal layer 130a and another portion of the lower interlayer insulating layer 140a adjacent to the interfacial surface between the second region and the third region R2 and R3. The lower metal layer 130c may be divided by the fourth and fifth step portions S4 and S5 and the first lower light reflective layer 111, the second lower light reflective layer 121, and the third light reflective layer 131 may be formed as illustrated in FIG. 2B and the other figures. In the process of forming the fourth and fifth step portions S4 and S5, a portion of an upper surface of the circuit region insulating layer 109 may be free of other layers or structures. As the fourth and fifth step portions S4 and S5 are also formed in an adjacent pixel P in the same process described above, a step portion may be formed on the second lateral surface of the first lower light reflective layer 111 opposing the first lateral surface on which the fourth step portion S4 is formed.

Figure 16:
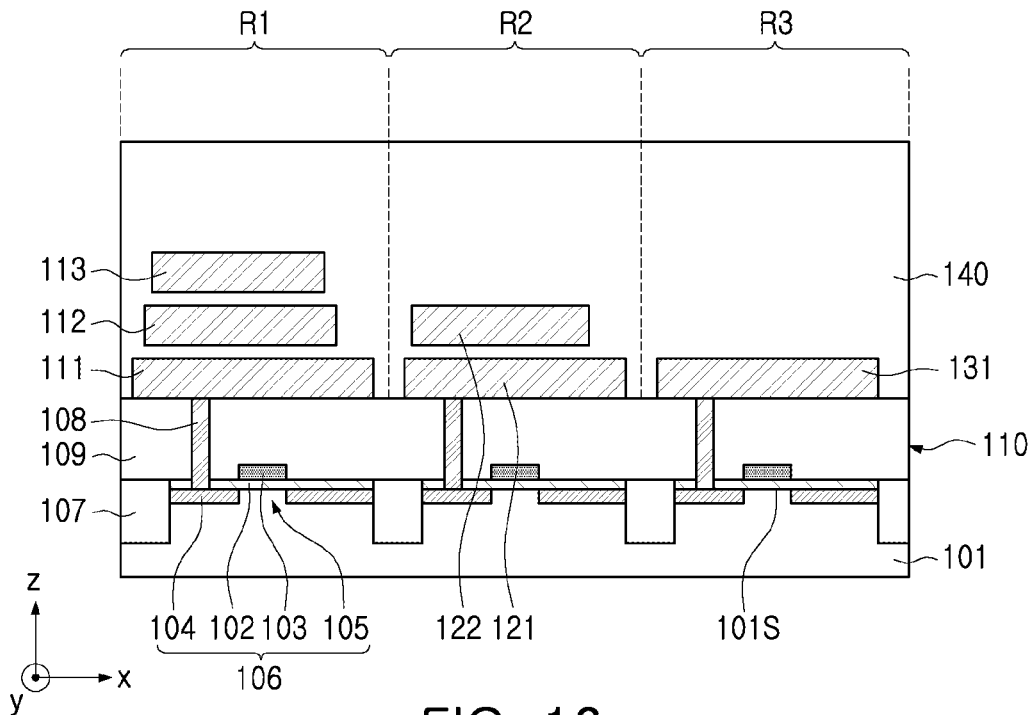

Referring to FIGS. 11A and 16, an insulating material layer included in the insulating layer 140 along with the interlayer insulating layers 140a, 140b, and 140c may be formed, the insulating material layer being on and at least partially covering the stack structure patterns PP and having a planarized upper portion (S30). A preliminary insulating layer on and at least partially covering the first to fifth step portions S1, S2, S3, S4, and S5 of the stack structure patterns PP with an insulating material and on and at least partially covering upper portions of the stack structure patterns PP and having a certain thickness may be formed. An insulating material layer may be formed by planarizing an upper portion of the preliminary insulating layer. The insulating material layer may include a material substantially the same as a material of the interlayer insulating layers 140a, 140b, and 140c and may be included in the insulating layer 140 along with the interlayer insulating layers 140a, 140b, and 140c.

In another example embodiment, after the process of forming the insulating layer 140 and before the process of forming a light emitting portion EP, a separation insulating layer 145 penetrating the insulating layer 140 and disposed between the stack structure patterns PP may be formed. Referring back to FIGS. 5A and 5B, a trench extending in the x direction and the y direction between the stack structure patterns PP and penetrating the insulating layer 140 may be formed, and the trench may have a material deposited therein having a low absorptivity and having electrical insulating properties or a material having light reflective properties, thereby forming the separation insulating layer 145.

Figure 17:
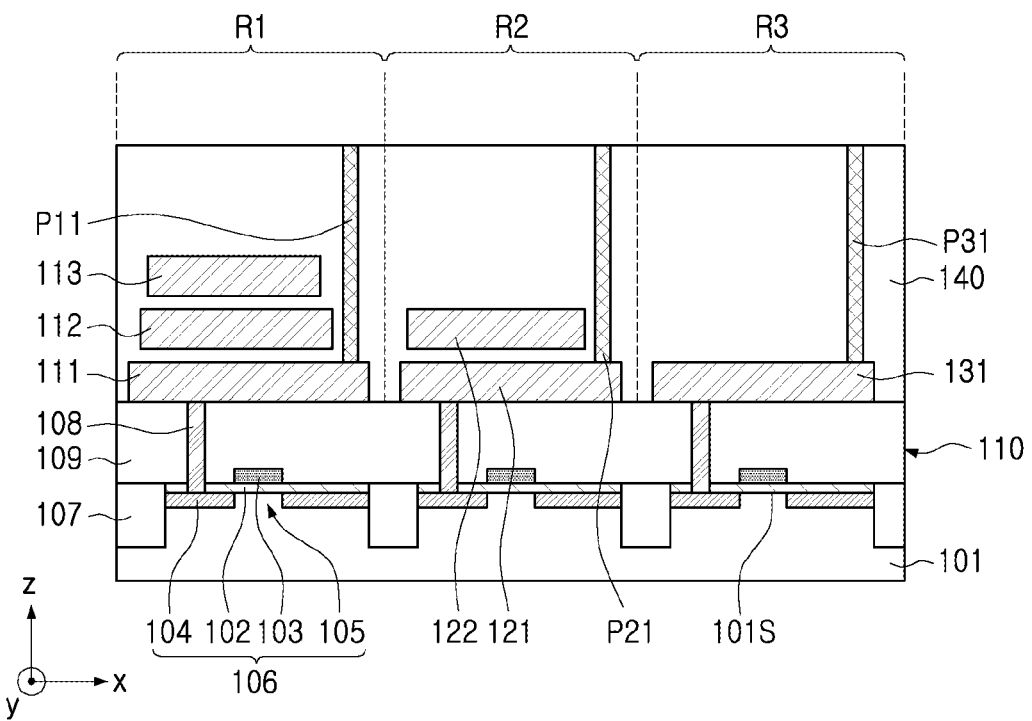

Referring to FIGS. 11a, 11c, and 17, via plugs P penetrating the insulating layer 140 and connected to the metal layers 130a, 130b, and 130c divided from one another, respectively, may be formed (S40).

Via holes may penetrate the insulating layer 140, such that a portion of an upper surface of each of the metal layers 130a, 130b, and 130c may be formed (S43) to be free of other layers or structures. The via holes may be formed by anisotropically etching the insulating layer 140 using a mask layer. The via holes may have different heights in accordance with the metal layers 130a, 130b, and 130c connected to the via holes in the insulating layer 140.

The via holes may be at least partially filled with a conductive material (S46). An internal region of each of the via holes may be at least partially filled with one or more conductive materials, such as tungsten (W), copper (Cu), or the like. The conductive material(s) may at least partially fill the internal regions of the via holes and may also be stacked on an upper surface of the insulating layer 140.

A portion of the conductive material may be removed through an etch-back process (S49). By the etch-back process, the conductive material(s) stacked on the upper surface of the insulating layer 140 may be removed, a conductive material in the via holes may also be partially removed, but example embodiments thereof are not limited thereto. By the etch-back process, via plugs including tungsten may be formed, and an upper surface of each of the via plugs may be substantially coplanar with an upper surface of the insulating layer 140.

Figure 18:
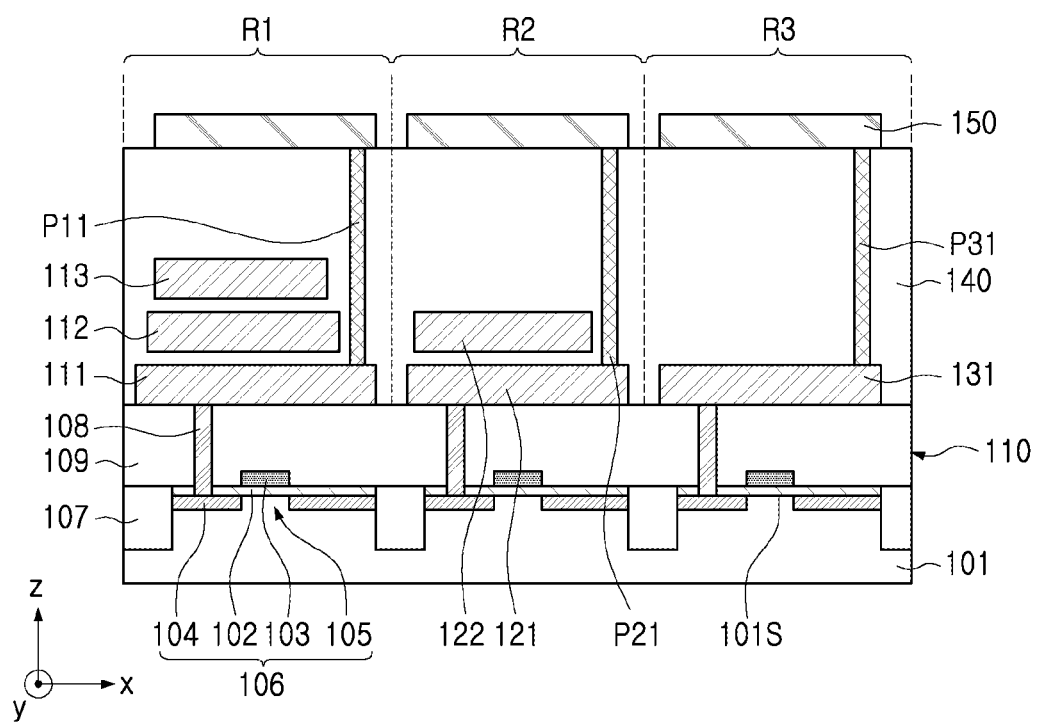

Referring to FIGS. 1, 11A, and 18, a light emitting portion EP including first electrodes 150, a light emitting layer 160, and a second electrode 170 may be formed on the insulating layer 140 (S50).

The first electrodes 150 on and at least partially covering an upper surface of the insulating layer 140 and connected to via plugs may be formed. The first electrodes 150 may be spaced apart from each other in the x direction and the y direction, and may correspond to sub-pixels SP. The first electrodes 150 may have substantially the same thickness.

The light emitting layer 160 on and at least partially covering an upper surface of each of the first electrodes 150 and on and at least partially covering a portion of an upper surface of the insulating layer 140, the second electrode 170 on and at least partially covering an upper surface of the light emitting layer 160, the encapsulation layer 180 on and at least partially covering an upper surface of the second electrode 170, and color filters 190 on and at least partially covering an upper surface of the encapsulation layer 180 may be formed in order. The encapsulation layer 180 and the second electrode 170 may be common layers, and may extend in the x direction and the y direction. The encapsulation layer 180 may protect the second electrode 170 and the light emitting layer 160 disposed below the encapsulation layer 180, and the color filters 190 may include a red color filter 190R, a green color filter 190G, and a blue color filter 190B corresponding to respective sub-pixels P. Although not illustrated, a barrier including a light blocking material may be formed between the color filters 190.

Figure 19A:
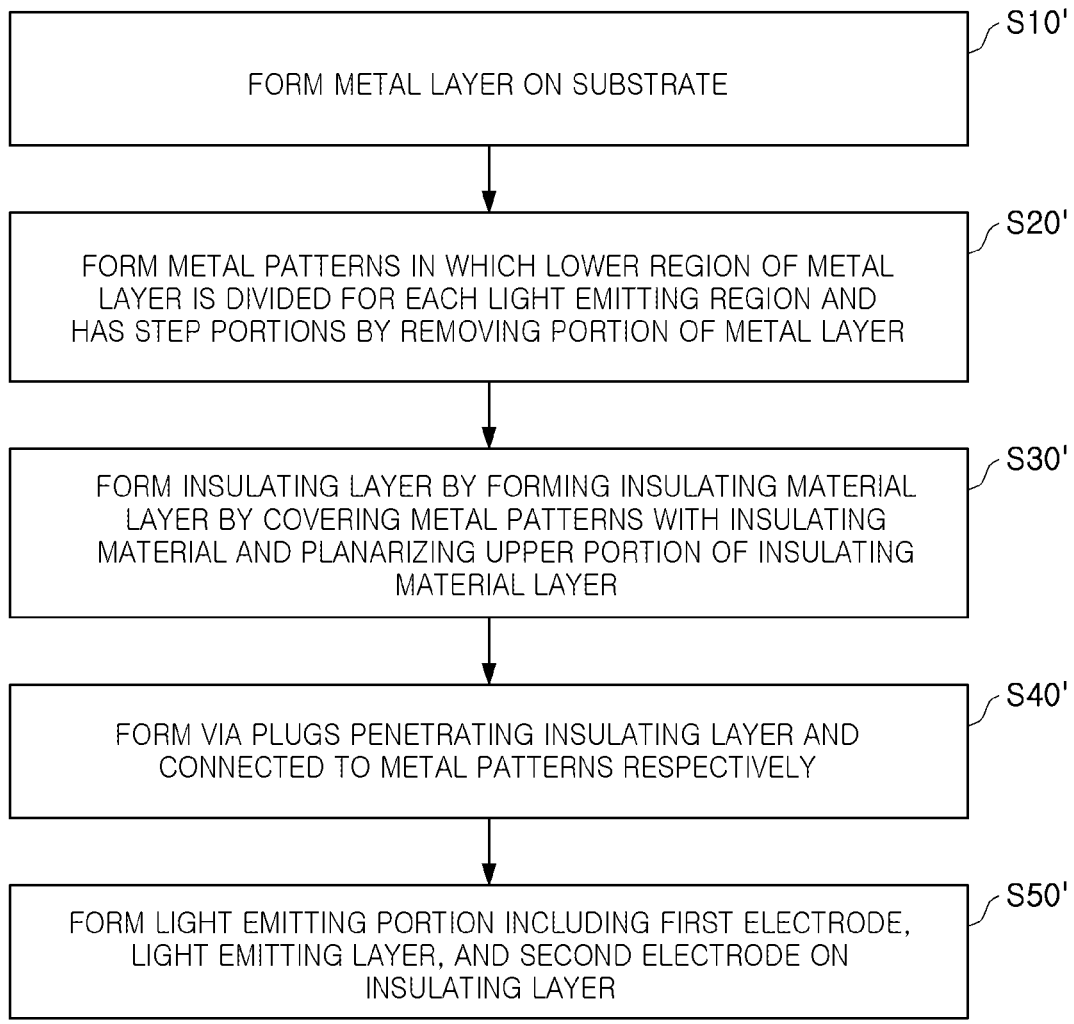
FIGS. 19A and 19B are flowcharts illustrating a method of manufacturing a light emitting device according to some example embodiments of the present inventive concept.
Figure 19B:
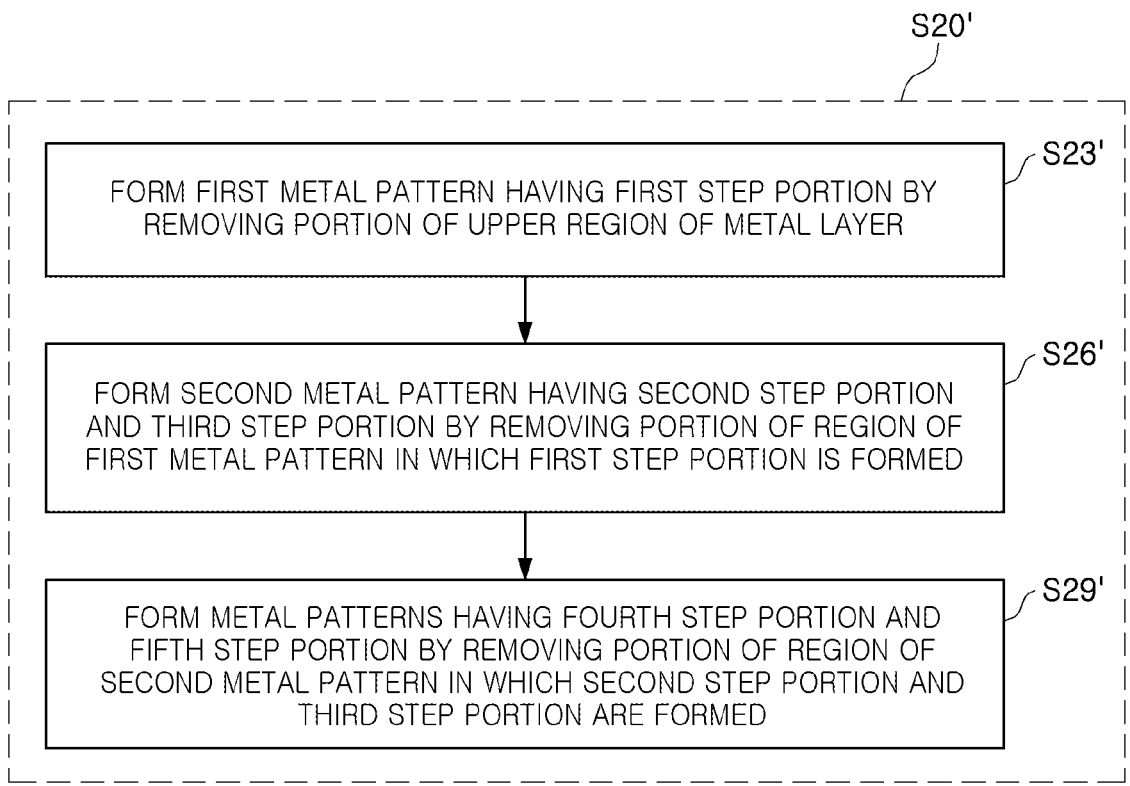

In the description below, a method of manufacturing a light emitting device will be described in accordance with some example embodiments with reference to FIGS. 19A to 26. FIGS. 19A and 19B are flowcharts illustrating a method of manufacturing a light emitting device according to some example embodiments. FIGS. 20 to 26 are diagrams illustrating processes of a method of manufacturing a light emitting device according to some example embodiments.

Figure 20:
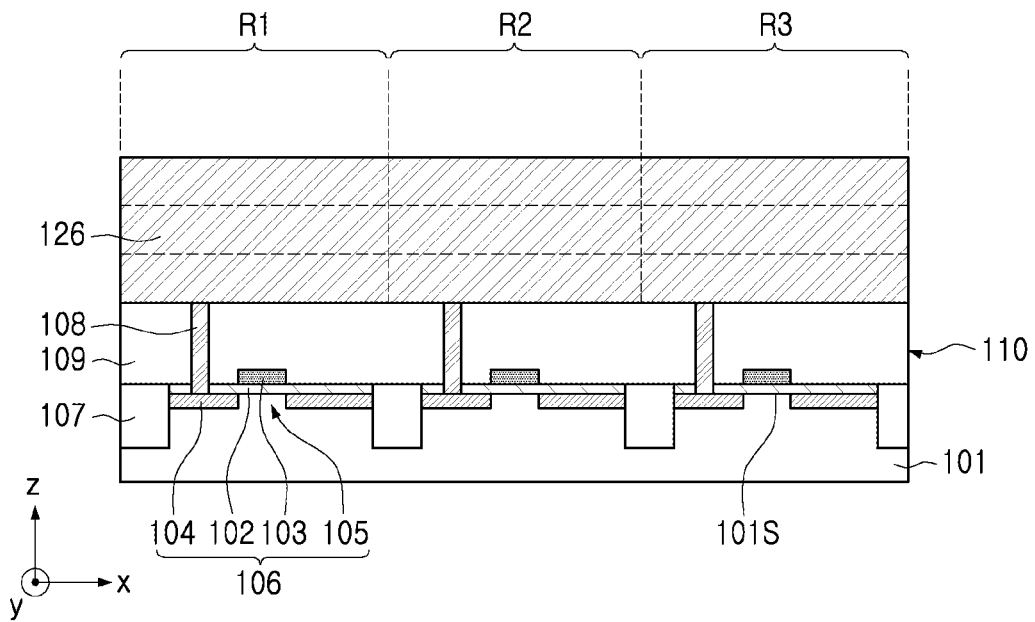
FIGS. 20 to 26 are diagrams illustrating a method of manufacturing a light emitting device according to some example embodiments of the present inventive concept.

Referring to FIGS. 19A and 20, a substrate 101 may be prepared, and a metal layer 126 may be stacked on the substrate 101 (S10'). The metal layer 126 may have a substantially uniform thickness, and may include a first region R1, a second region R2, and a third region R3, corresponding to the sub-pixel SP described with reference to FIG. 1.

The circuit region 110 may be formed on the substrate 101 before stacking the metal layer 126 on the substrate 101. The circuit region 110 may include circuit devices 106, circuit contact plugs 108, and a circuit region insulating layer 109, and the circuit devices 106 may include a gate insulating layer 102, a gate electrode 103, source/drain regions 104, and a channel region 105.

In another example embodiment, buffer layers may further be formed in the metal layer 126 in the process of stacking the metal layer 126 on the substrate 101.

Referring to FIGS. 19A and 19B, and FIGS. 21 to 23, a lower region of the metal layer 126 may be divided for each light emitting region by removing a portion of the metal layer 126, and metal patterns 129 having a plurality of step portions may be formed (S20').

Figure 21:
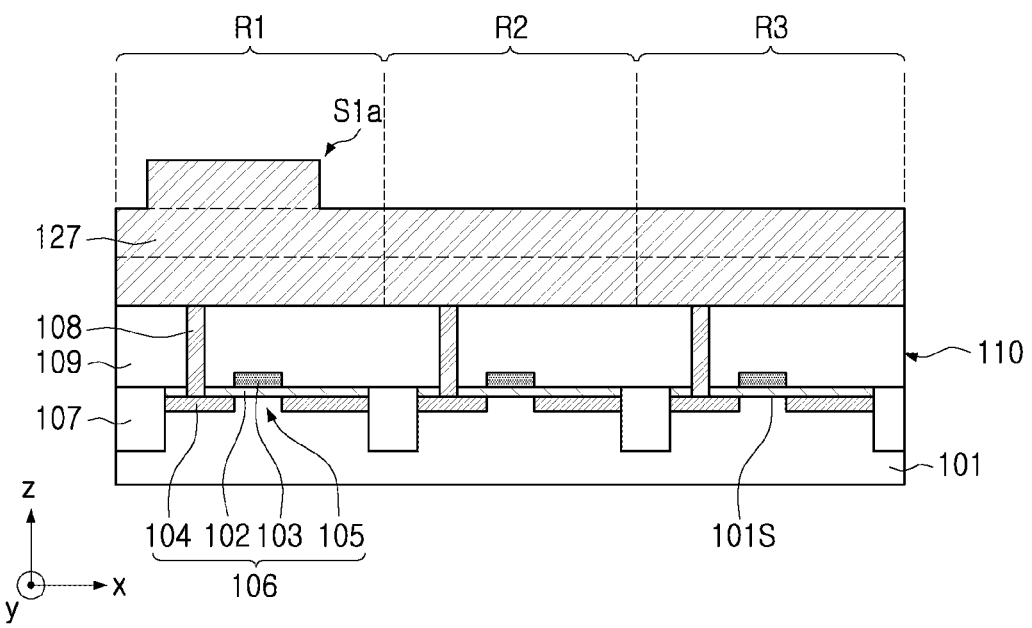

Referring to FIGS. 1, 19B and 21, a first metal pattern 127 having a first step portion S1a may be formed by removing a portion of an upper region of the metal layer 126 (S23'). The first step portion S1a may be formed in the first region R1, and the first metal pattern 127 may be formed by removing a portion of an upper region of the metal layer 126 on the second and third regions R2 and R3. A lateral surface of the first metal pattern 127 may be free of other layers or structures in the first region R1. As the first step portion S1a is also formed in an adjacent pixel P in the same process described above, a step portion may also be formed on a second lateral surface of the first metal pattern 127 opposing the first lateral surface on which the first step portion S1a is formed in the first region R1.

Figure 22:
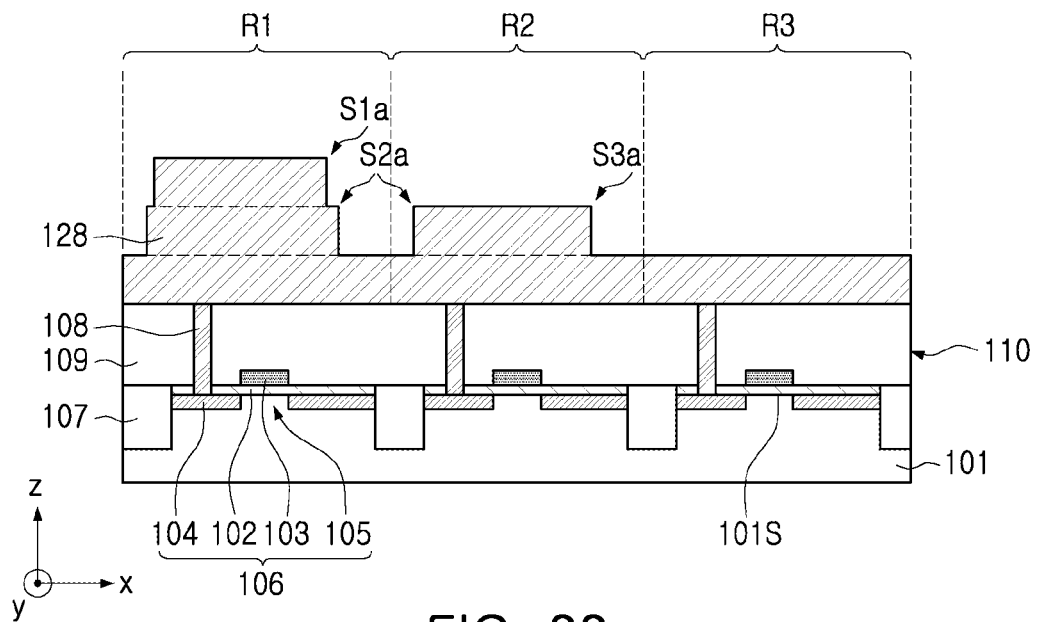

Referring to FIGS. 1, 19B, and 22, a second metal pattern 128 having a second step portion S2a and a third step portion S3a may be formed by removing a portion of the region of the first metal pattern 127 in which the first step portion S1a is formed (S26'). The second step portion S2a may be formed by removing a portion of the first metal pattern 127 adjacent to an interfacial surface between the first and second regions R1 and R2, and the third step portion S3a may be formed by removing another portion of the first metal pattern 127 between the second and third regions R2 and R3. The interlayer metal layer 130b may be divided by the second and third step portions S2 and S3, a first intermediate light reflective layer 112a and a second upper light reflective layer 122a may be formed as illustrated in FIG. 7A, and a portion of the first metal pattern 127 on the third region R3 may be removed by the third step portion S3a. As the second and third regions R2 and R3 are also formed in an adjacent pixel P in the same process described above, a step portion may also be formed on the second surface of the second metal pattern 128 opposing the first surface on which the second step portion S2a is formed in the first region R1.

Figure 23:
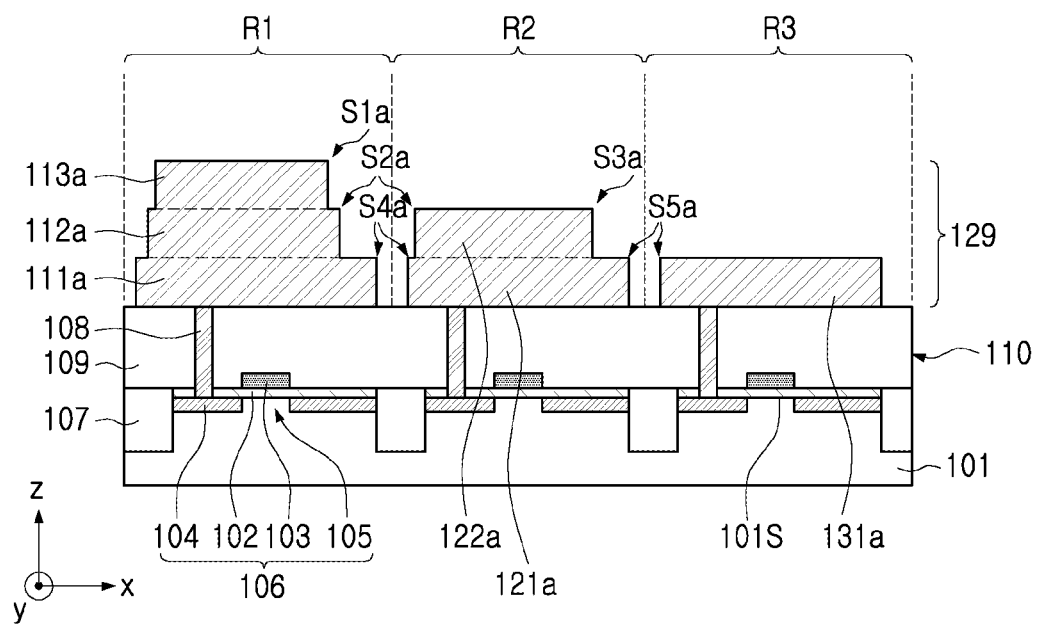

Referring to FIGS. 1, 19B, and 23, metal patterns 129 having a fourth step portion S4a and a fifth step portion S5a may be formed by removing a portion of a region of the second metal pattern 128 in which the second step portion S2a and the third step portion S3a are formed (S29'). The fourth step portion S4a may be formed by removing a portion of the second metal pattern 128 in a region in which the second step portion S2a is formed, and the fifth step portion S5a may be formed by removing another portion of the second metal pattern 128 in a region in which the third step portion S3a is formed. The second metal pattern 128 may be divided by the fourth and fifth step portions S4a and S5a, and a first lower light reflective layer 111a, a second lower light reflective layer 121a, and a third light reflective layer 131a may be formed as illustrated in FIG. 2B and the other figures. Accordingly, metal patterns 129 including the first lower light reflective layer 111a, the first intermediate light reflective layer 112a, and the first upper light reflective layer 113a disposed in the first region R1, the second lower light reflective layer 121a and the second upper light reflective layer 122a disposed in the second region R2, and the third light reflective layer 131a disposed in the third region R3 may be formed. As the fourth and fifth step portions S4a and S5a are also formed in an adjacent pixel P in the same process described above, a step portion may also be formed on the second lateral surface of the first lower light reflective layer 111a opposing the first lateral surface on which the fourth step portion S4a is formed in the first region R1, and a step portion may also be formed on a second lateral surface of the third light reflective layer 131a opposing the first surface on which the fifth step portion S5a is formed in the third region R3.

Figure 24:
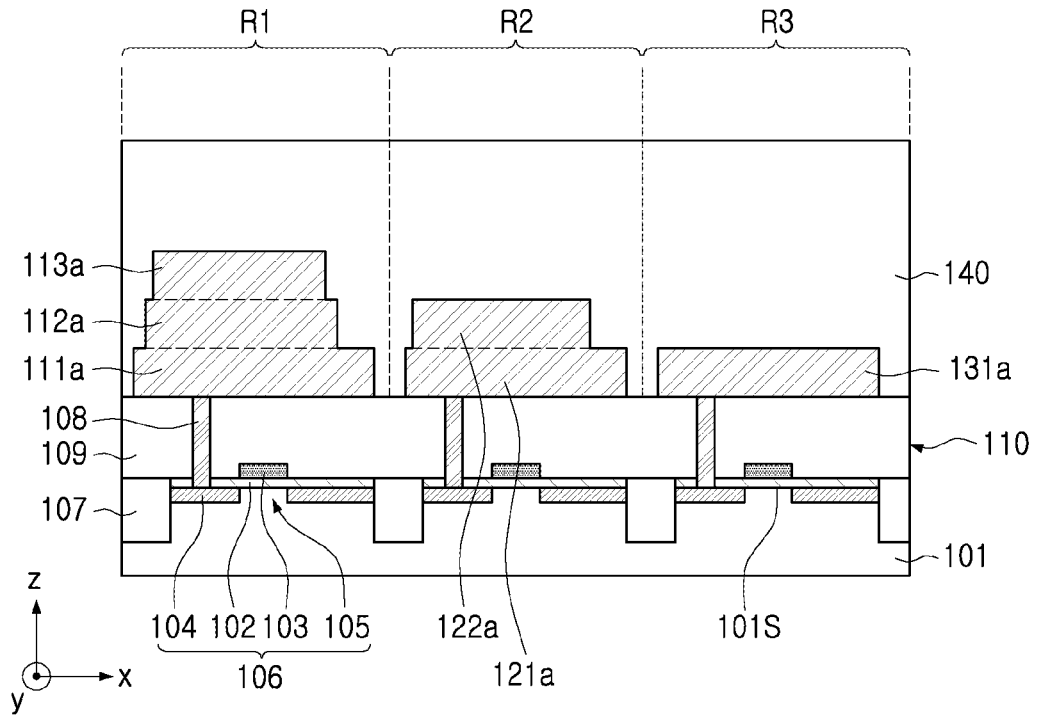

Referring to FIGS. 19A and 24, an insulating material layer may be formed on the metal patterns 129 with an insulating material and the upper portion of the insulating material layer (S30') may be planarized. An insulating layer may be formed by forming an insulating material layer on the first to fifth step portions S1a, S2a, S3a, S4a, and S5a of the metal patterns 129 with an insulating material and on an upper portion of each of the metal patterns 129 so as to have a certain thickness. The upper portion of the insulating material layer may be planarized.

Figure 25:
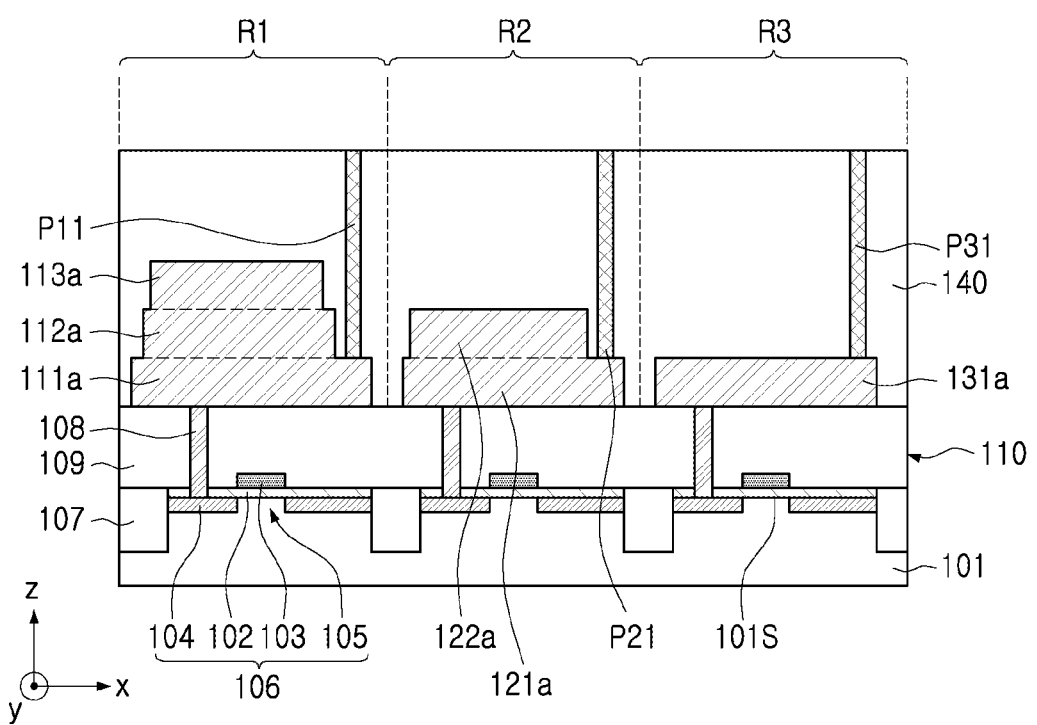

Referring to FIGS. 19A and 25, via plugs P penetrating the insulating layer 140 and connected to the metal patterns 129, respectively, may be formed (S40'). As the process of forming the via plugs P is the same as in the aforementioned example embodiment described with reference to FIGS. 11C and 17, the descriptions thereof will not be repeated.

Figure 26:
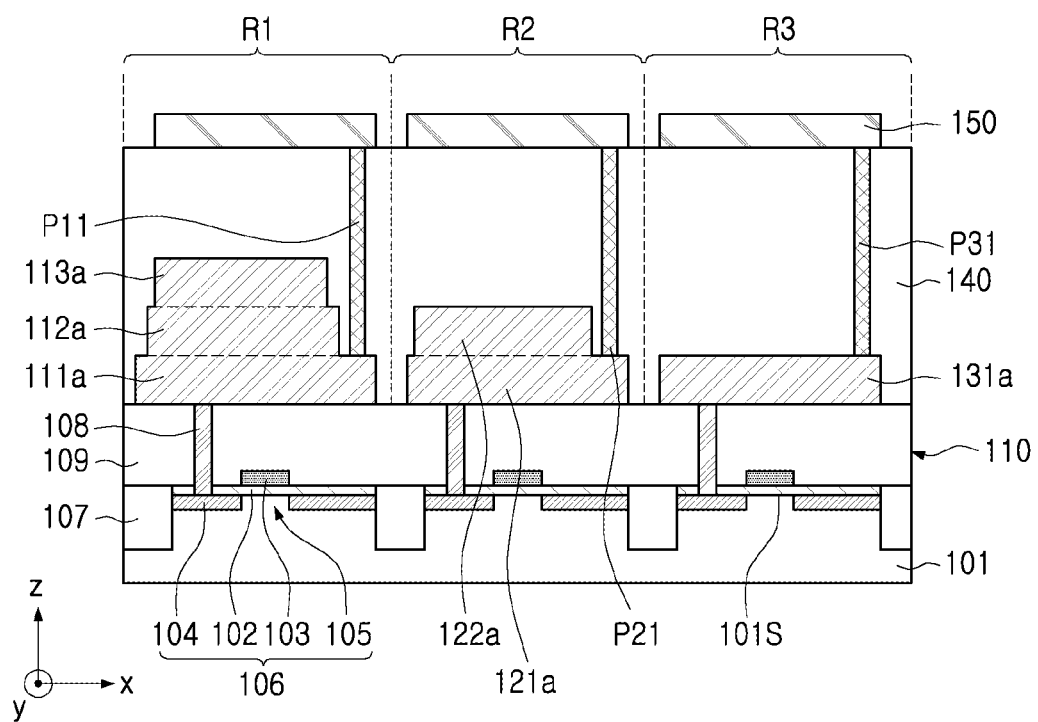

Referring to FIGS. 1, 19A and 26, the light emitting portion EP including the first electrodes 150, the light emitting layer 160, and the second electrode 170 may be formed on the insulating layer 140 (S50'). As the process of forming the light emitting portion EP is the same as in the aforementioned example embodiment described with reference to FIGS. 11A and 18, the descriptions thereof will not be repeated.

According to the aforementioned example embodiments, by controlling the structures of the light reflective layers formed in a multilayer structure, the insulating layer on the light reflective layers, and the via plugs connecting the light reflective layers, a light emitting device having improved color purity and an improved light emitting efficiency may be provided.

Also, as the via plugs penetrating the insulating layer may include tungsten (W) used in the semiconductor process, a light emitting device having improved integration density may be provided.

While the example embodiments have been shown and described above, it will be apparent to those skilled in the art that modifications and variations could be made without departing from the scope of the present inventive concept as defined by the appended claims.

What is claimed is:

1. A light emitting device, comprising:
a substrate;
a circuit region including a circuit device on the substrate;
an insulating layer on the circuit region;
a first light emitting region connecting portion, a second light emitting region connecting portion, and a third light emitting region connecting portion in the insulating layer; and
a light emitting portion including a first light emitting region on the first light emitting region connecting portion, a second light emitting region on the second light emitting region connecting portion, and a third light emitting region on the third light emitting region connecting portion,
wherein the first light emitting region connecting portion includes first light reflective layers including a first lower light reflective layer, a first intermediate light reflective layer on the first lower light reflective layer, and a first upper light reflective layer on the first intermediate light reflective layer, and one or more first via plugs connected to the first light emitting region, wherein the second light emitting region connecting portion includes second light reflective layers including a second lower light reflective layer, and a second upper light reflective layer on the second lower light reflective layer, and one or more second via plugs connected to the second light emitting region, wherein the third light emitting region connecting portion includes a third light reflective layer, and a third via plug connected to the third light emitting region, and wherein the first lower light reflective layer extends farther than at least one of the first intermediate light reflective layer and the first upper light reflective layer in at least one direction parallel to an upper surface of the substrate.

2. The light emitting device of claim 1,
wherein the second lower light reflective layer extends farther than the second upper light reflective layer in the at least one direction parallel to the upper surface of the substrate.

3. The light emitting device of claim 1, wherein an area of an upper surface of the first lower light reflective layer is greater than an area of an upper surface of the first intermediate light reflective layer, the area of the upper surface of the first intermediate light reflective layer is greater than an area of an upper surface of the first upper light reflective layer, and an area of an upper surface of the second lower light reflective layer is greater than an area of an upper surface of the second upper light reflective layer.

4. The light emitting device of claim 1,
wherein one of the one or more first via plugs is connected to the first lower light reflective layer,
wherein one of the one or more second via plugs is connected to the second lower light reflective layer, and
wherein the third via plug is connected to the third light reflective layer.

5. The light emitting device of claim 4,
wherein the one of the one or more first via plugs connected to the first lower light reflective layer is in a region at which the first lower light reflective layer does not overlap the first intermediate light reflective layer, in a plan view of the light emitting device, and
wherein the one of the one or more second via plugs connected to the second lower light reflective layer is in a region at which the second lower light reflective layer does not overlap the second upper light reflective layer, in a plan view of the light emitting device.

6. The light emitting device of claim 4,
wherein ones of the one or more first via plugs are connected to the first lower light reflective layer, the first intermediate light reflective layer, and the first upper light reflective layer, respectively, and
wherein ones of the one or more second via plugs are connected to the second lower light reflective layer and the second upper light reflective layer, respectively.

7. The light emitting device of claim 1,
wherein an upper surface of the insulating layer is parallel to an upper surface of the substrate; and
wherein the insulating layer has different thicknesses at regions between the first, second, and third light emitting regions and the first, second, and third light emitting region connecting portions to form a resonant cavity structure.

8. The light emitting device of claim 7,
wherein the insulating layer has a first thickness from an upper surface of the first upper light reflective layer to an upper surface of the insulating layer, has a second thickness from an upper surface of the second upper light reflective layer to an upper surface of the insulating layer, and has a third thickness from an upper surface of the third light reflective layer to an upper surface of the insulating layer, and
wherein the first thickness is less than the second thickness, and the second thickness is less than the third thickness.

9. The light emitting device of claim 1, wherein each of the first, second, and third light emitting regions includes first electrodes, a light emitting layer, and a second electrode.

10. The light emitting device of claim 1,
wherein the circuit device includes a gate insulating layer, a gate electrode on the gate insulating layer, and source and drain regions in the substrate on both sides of the gate electrode, respectively, and
wherein the circuit device is connected to the first lower light reflective layer, the second lower light reflective layer, and the third light reflective layer through circuit contact plugs electrically connected to the source and drain regions.

11. A light emitting device, comprising:
a substrate;
an insulating layer on the substrate; and
a first light emitting region connecting portion, a second light emitting region connecting portion, and a third light emitting region connecting portion, in the insulating layer; and
a first lower electrode on the first light emitting region connection portion, a second lower electrode on the second light emitting region connection portion, and a third lower electrode on the third light emitting region connection portion,
wherein the first light emitting region connecting portion includes first light reflective layers having a multilayer structure, and vertically stacked in the insulating layer, and a first via plug directly connected to a first lowermost light reflective layer of the first light reflective layers and the first lower electrode,
wherein the second light emitting region connecting portion includes second light reflective layers having a multilayer structure, and vertically stacked in the insulating layer, and a second via plug directly connected to a second lowermost light reflective layer of the second light reflective layers and the second lower electrode, and
wherein the third light emitting region connecting portion includes a third light reflective layer in the insulating layer, and a third via plug directly connected to the third light reflective layer and the third lower electrode.

12. The light emitting device of claim 11, wherein the first light reflective layers have different widths with respect to each other in a first direction parallel to an upper surface of the substrate, and the second light reflective layers have different widths with respect to each other in the first direction.

13. The light emitting device of claim 11, further comprising:
a separation insulating layer between the first, second, and third light emitting region connecting portions, and extending in a direction perpendicular to an upper surface of the substrate.

14. The light emitting device of claim 11, further comprising:
- lower buffer layers disposed below the first lowermost light reflective layer, the second lowermost light reflective layer, and the third light reflective layer, respectively.

15. The light emitting device of claim 11, wherein the first and second light reflective layers each have a multilayer structure have thicknesses decreasing from lower layers closest to the substrate to upper layers farthest away from the substrate.

16. The light emitting device of claim 11, further comprising:
- a first light emitting region connected to the first via plug on the insulating layer;
- a second light emitting region connected to the second via plug on the insulating layer; and
- a third light emitting region connected to the third via plug on the insulating layer.

17. A light emitting device, comprising:
- a substrate having an upper surface extending in a first direction and a second direction;
- an insulating layer on the substrate;
- a first light reflective layer, a second light reflective layer, and a third light reflective layer, in the insulating layer and spaced apart from one another in the first direction;
- a light emitting portion on the insulating layer, and including first electrodes, a light emitting layer, and a second electrode; and
- a first connection via plug connecting the first light reflective layer to a first one of the first electrodes, a second connection via plug connecting the second light reflective layer to a second one of the first electrodes, and a third connection via plug connecting the third light reflective layer to a third one of the first electrodes,
- wherein at least one of the first, second, and third light reflective layers includes a plurality of stacked layers having different widths in the first direction,
- wherein the plurality of stacked layers include a first layer and a second layer on the first layer, and
- a first width of the first layer in the first direction is greater than a second width of the second layer in the first direction.

18. The light emitting device of claim 17, wherein the plurality of stacked layers have widths decreasing in the first direction from lower layers closer to the substrate to upper layers farther away from the substrate.

19. The light emitting device of claim 17, further comprising:
- buffer layers disposed on at least one of the first light reflective layer, the second light reflective layer, and the third light reflective layer or between at least one of the first light reflective layer, the second light reflective layer, and the third light reflective layer and the substrate.

* * * * *